(12) United States Patent
Neumann et al.

(10) Patent No.: US 12,328,089 B2
(45) Date of Patent: Jun. 10, 2025

(54) METHOD FOR CONTROLLING A PLANAR DRIVE SYSTEM, AND PLANAR DRIVE SYSTEM

(71) Applicant: Beckhoff Automation GmbH, Verl (DE)

(72) Inventors: Klaus Neumann, Gütersloh (DE); Benjamin Jurke, Gütersloh (DE); Alexander Weddemann, Lippstadt (DE); Dominik Sensen, Herzogenrath (DE); Keir Maguire, North Vancouver (CA)

(73) Assignee: Beckhoff Automation GmbH, Verl (DE)

( * ) Notice: Subject to any disclaimer, the term of this patent is extended or adjusted under 35 U.S.C. 154(b) by 211 days.

(21) Appl. No.: 18/059,064

(22) Filed: Nov. 28, 2022

(65) Prior Publication Data
US 2023/0107323 A1   Apr. 6, 2023

Related U.S. Application Data

(63) Continuation of application No. PCT/EP2021/065425, filed on Jun. 9, 2021.

(30) Foreign Application Priority Data

Jun. 10, 2020  (DE) .................... 10 2020 115 449.6

(51) Int. Cl.
*H02P 6/00*  (2016.01)
*H02K 11/215*  (2016.01)
*H02K 41/03*  (2006.01)

(52) U.S. Cl.
CPC ............ *H02P 6/006* (2013.01); *H02K 11/215* (2016.01); *H02K 41/031* (2013.01); *H02K 2201/18* (2013.01)

(58) Field of Classification Search
CPC ...... H02P 6/006; H02K 11/215; H02K 41/031
See application file for complete search history.

(56) References Cited

U.S. PATENT DOCUMENTS

| | | | |
|---|---|---|---|
| 6,922,025 B2* | 7/2005 | Smith .................. | H02P 6/10 318/568.22 |
| 9,645,167 B2 | 5/2017 | Lal et al. | |

(Continued)

FOREIGN PATENT DOCUMENTS

| | | |
|---|---|---|
| CN | 103620418 A | 3/2014 |
| CN | 105452812 A | 3/2016 |

(Continued)

OTHER PUBLICATIONS

Office Action dated Dec. 29, 2023 in connection with Chinese patent application No. 202180040813.1, 8 pages including English translation.

(Continued)

*Primary Examiner* — Rina I Duda
(74) *Attorney, Agent, or Firm* — Dorsey & Whitney LLP

(57) ABSTRACT

A method for controlling a planar drive system includes controlling a rotor along a control path starting from a first position on a stator module, and determining a sensor pattern for magnetic field sensors of a sensor module. The sensor pattern includes a subset of the magnetic field sensors with at least one of the magnetic field sensors not comprised by the sensor pattern, and an area of the sensor pattern is at least partially covered by the rotor in a position along the control path. The method includes measuring values of the rotor magnetic field with the aid of the magnetic field sensors of the sensor pattern, detecting the rotor, and determining a second position of the rotor based on the measured values. The invention further relates to a planar drive system.

17 Claims, 12 Drawing Sheets

(56) References Cited

U.S. PATENT DOCUMENTS

| | | | |
|---|---|---|---|
| 9,923,433 B2* | 3/2018 | Sangermano | G01D 5/2458 |
| 10,222,237 B2 | 3/2019 | Lu | |
| 11,437,893 B2 | 9/2022 | Brinkmann et al. | |
| 11,489,428 B2 | 11/2022 | Brinkmann et al. | |
| 2012/0074890 A1* | 3/2012 | Coakley | G05B 19/401 |
| | | | 318/653 |
| 2015/0241525 A1* | 8/2015 | Yang | G01R 33/0029 |
| | | | 318/135 |
| 2018/0205304 A1 | 7/2018 | Lu | |
| 2020/0303997 A1 | 9/2020 | Brinkmann et al. | |
| 2020/0304008 A1 | 9/2020 | Brinkmann et al. | |

FOREIGN PATENT DOCUMENTS

| | | |
|---|---|---|
| DE | 102017131314 A1 | 6/2019 |
| DE | 102017131320 A1 | 6/2019 |
| WO | 2015017933 A1 | 2/2015 |
| WO | 2019129561 A1 | 7/2019 |
| WO | 2019129566 A1 | 7/2019 |

OTHER PUBLICATIONS

Chen et al. "A 6-DOF Measurement Solution for Permanent Magnet Synchronous Planar Motors Based on Motion Continuity Principle," IEEE Transactions of Instrumentation and Measurement, vol. 65, No. 3, Mar. 2016.

International Preliminary Report on Patentability dated Apr. 20, 2022 in connection with International Patent Application No. PCT/EP2021/065425, 45 pages including English translation.

International Search Report and Written Opinion dated Sep. 9, 2021 in connection with International Patent Application No. PCT/EP2021/065425, 19 pages including English translation.

* cited by examiner

METHOD FOR CONTROLLING A PLANAR DRIVE SYSTEM, AND PLANAR DRIVE SYSTEM

CROSS-REFERENCE TO RELATED APPLICATIONS

This patent application is a continuation of International Patent Application No. PCT/EP2021/065425, filed 9 Jun. 2021, METHOD FOR CONTROLLING A PLANAR DRIVE SYSTEM, AND PLANAR DRIVE SYSTEM, which claims the priority of German patent application DE 10 2020 115 449.6, filed 10 Jun. 2020, VERFAHREN ZUM STEUERN EINES PLANARANTRIEBSSYSTEMS UND PLANARANTRIEBSSYSTEM, the disclosure content of each of which is hereby incorporated by reference herein, in the entirety and for all purposes.

FIELD

The invention relates to a method for controlling a planar drive system, and to a planar drive system configured to carry out the method for controlling a planar drive system.

BACKGROUND

Planar drive systems may be used, among other things, in automation technology, in particular manufacturing technology, handling technology and process engineering. Planar drive systems may be used to move or position a moving element of a system or machine in at least two linearly independent directions. Planar drive systems may comprise a permanently energized electromagnetic planar motor with a planar stator and a rotor movable on the stator in at least two directions.

In a permanently energized electromagnetic planar motor, a driving force is exerted on the rotor by current-carrying conductors magnetically interacting with driving magnets of a magnet arrangement. The invention relates in particular to embodiments of planar drive systems in which the drive magnets of an electric planar motor are arranged on the rotor and the current-carrying conductors of the planar motor are arranged in a stationary planar stator.

In such a drive system, the rotor comprises at least a first magnet unit for driving the rotor in a first direction and a second magnet unit for driving the rotor in a second direction linearly independent of the first direction, e.g. in a direction orthogonal to the first direction. The planar stator comprises at least a group of first energizable conductors magnetically interacting with the magnets of the first magnet unit to drive the rotor in the first direction, and a group of second energizable conductors magnetically interacting with the magnets of the second magnet unit to drive the rotor in the second direction. The first and second groups of conductors are generally independently energizable to allow independent movement of the rotor in the first and second direction. If the conductors of the first and second groups themselves may be energized independently of each other at least in parts, a plurality of rotors may be moved independently of each other on one stator at the same time.

To control a rotor of a planar drive system, it is essential to be able to determine a position of the rotor relative to the stator module or stator modules of the planar drive system. For this purpose, each stator module comprises at least a sensor module with a plurality of magnetic field sensors that are set up to detect the magnetic field of the rotor, which makes it possible to determine the position of the rotor relative to the respective sensor module or relative to the respective stator module. For precise and energy-saving control of a planar drive system, it is essential to select only those magnetic field sensors of the sensor module that can make a relevant contribution to the position determination of the rotor to be controlled.

SUMMARY

A method for controlling a planar drive system is provided, which allows for an improved and more precise control of the rotor due to an efficient selection of the relevant magnetic field sensors for determining a position of a rotor. Further a planar drive system is provided which is arranged to carry out the method according to the invention.

EXAMPLES

A method for controlling a planar drive system is provided, wherein the planar drive system comprises at least a controller, a stator module, and a rotor, wherein the rotor may be driven and controlled via a magnetic coupling between a rotor magnetic field of the rotor and a stator magnetic field of the stator module, wherein the stator module comprises a sensor module having a plurality of magnetic field sensors for determining a position of the rotor, and wherein each magnetic field sensor is configured to determine the rotor magnetic field for a spatial region, the method comprising:
  controlling the rotor along a control path starting from a first position on the stator module, in one controlling step;
  determining a sensor pattern of the magnetic field sensors of the sensor module in a sensor pattern determining step, wherein a sensor pattern comprises a subset of the magnetic field sensors of the sensor module of the stator module, wherein the sensor module comprises at least a magnetic field sensor not comprised by the sensor pattern, and wherein an area of the sensor pattern is at least partially covered by the rotor in a position along the control path;
  measuring measured values of the rotor magnetic field with the aid of the magnetic field sensors of the sensor pattern in a rotor magnetic field determining step; and
  detecting the rotor and determining a second position of the rotor based on the measured values of the rotor magnetic field measured with the aid of the magnetic field sensors of the sensor pattern in a position determining step.

This achieves the technical advantage that a method for controlling a planar drive system may be provided in which only relevant magnetic field sensors of the sensor module of the stator module are selected for a position determination of the rotor on the stator module of the planar drive system.

For this purpose, a sensor pattern of the magnetic field sensors of the sensor module is determined in a sensor pattern determining step, by which measured values of the rotor magnetic field of the rotor are recorded in a rotor magnetic field determining step. This ensures that only the magnetic field sensors of the sensor pattern are used to determine the position of the rotor by recording corresponding measured values of the rotor magnetic field. The sensor pattern may be selected in such a way that all magnetic field sensors of the selected sensor pattern are covered by the rotor for a position to be determined.

This means that only magnetic field sensors that can record a relevant amount of the rotor magnetic field may be used to determine the position. This contributes to the precision of the determination of the rotor magnetic field and thus to the position determination of the rotor on the stator module. Furthermore, by limiting the magnetic field sensors used for position determining to the magnetic field sensors of the selected sensor pattern, it may be achieved that only a minimum number of the magnetic field sensors of the sensor module need to be evaluated for each position determination of the rotor on the stator module. This makes it possible to accelerate the processing of the recorded measured values and thus accelerate the determination of the position of the rotor on the stator module. Furthermore, by selecting the magnetic field sensors that can make a substantial contribution to the determination of the rotor magnetic field, computing capacity of the control system is saved. Furthermore, by selecting the appropriate magnetic field sensors, the data volume of the measured values of the magnetic field sensors to be processed for determining the rotor magnetic field may be reduced.

Herein, a planar drive system may be provided that has precise and improved control and is configured to perform the method of the invention with the advantages herein.

BRIEF DESCRIPTION OF THE DRAWINGS

The invention is explained in more detail with reference to the accompanying figures, which show:

FIG. 6 is a further flowchart of the method for controlling a planar drive system according to a further embodiment;

DETAILED DESCRIPTION

Figure 1:
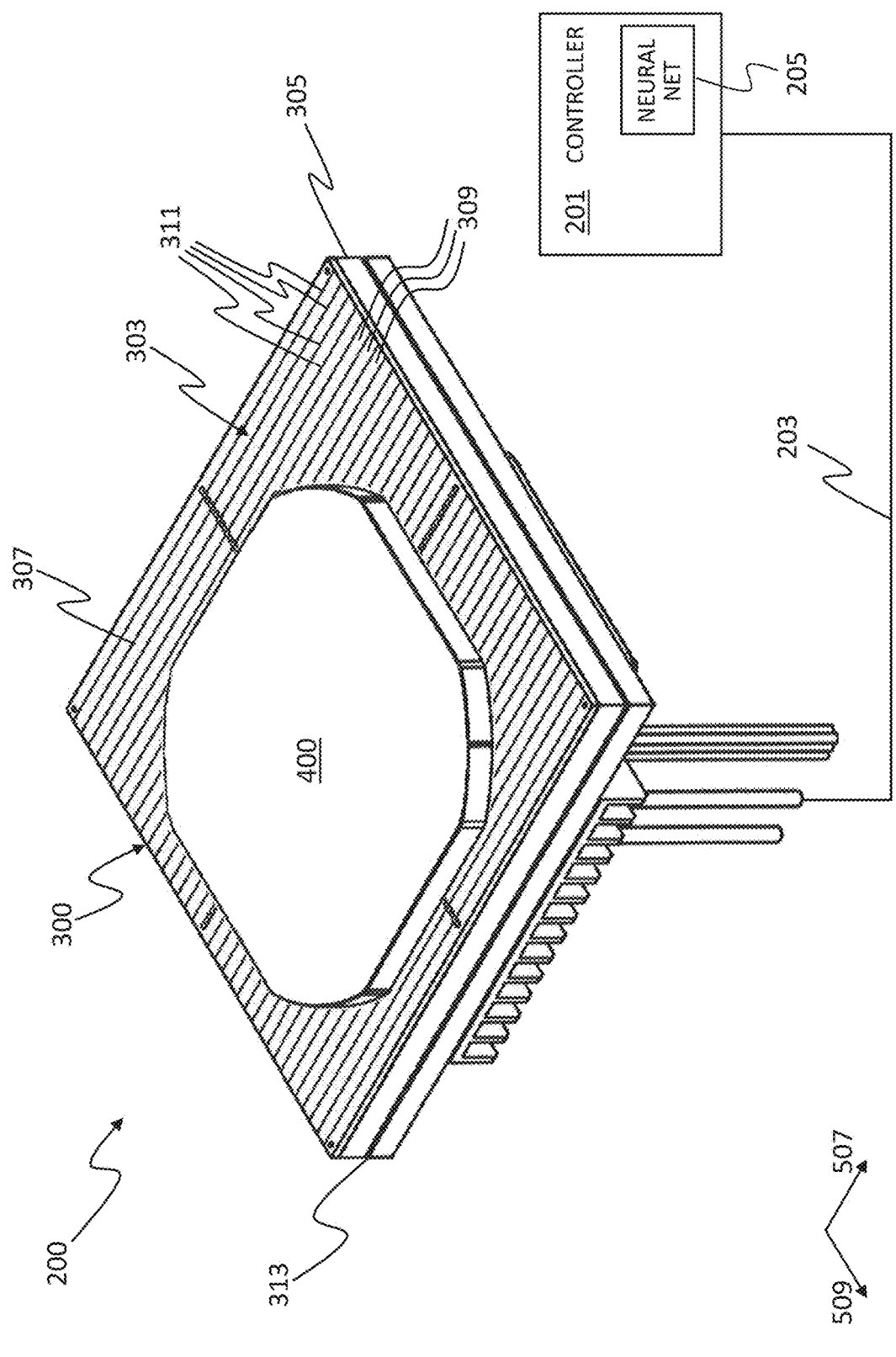
FIG. 1 is a schematic depiction of a planar drive system with a stator module and a rotor according to an embodiment.

For the purposes of the application, a sensor pattern is a set of magnetic field sensors of the sensor module that cover a contiguous area of the stator module. A sensor pattern may have any two-dimensional shape and comprise any number of magnetic field sensors. A sensor pattern may be arbitrarily shifted on the stator module, wherein the respective sensor pattern comprises different magnetic field sensors of the sensor module. A sensor pattern may further comprise magnetic field sensors of a plurality of stator modules coupled to one another, or arranged side by side with respect to one another and/or adjacent to one another. A sensor pattern may be used to record a corresponding pattern of measured values of the magnetic field sensors of the sensor pattern, via which a two-dimensional description of the rotor magnetic field is possible for the contiguous area of one or more stator modules covered by the sensor pattern.

According to an embodiment, the sensor pattern comprises at least a first sensor pattern and a second sensor pattern, wherein the first sensor pattern and the second sensor pattern are shifted with respect to one another in a first orientation direction, and wherein the rotor magnetic field determining step comprises:

measuring first measured values of the rotor magnetic field with the aid of the magnetic field sensors of the first sensor pattern in a first partial rotor magnetic field determining step; and measuring second measured values of the rotor magnetic field with the aid of the magnetic field sensors of the second sensor pattern in a second partial rotor magnetic field determining step;

wherein the position determining step comprises:

detecting the rotor and determining a first partial position of the rotor based on the first measured values of the rotor magnetic field measured with the aid of the magnetic field sensors of the first sensor pattern in a first partial rotor detecting step;

detecting the rotor and determining a second rotor partial position based on the measured values of the rotor magnetic field measured with the aid of the magnetic field sensors of the second sensor pattern in a second partial rotor detecting step;

determining a first weighting value of the first sensor pattern and a second weighting value of the second sensor pattern in a weighting step; and determining the second position of the rotor as a weighted average of the first partial position and the second partial position, taking into account the first weighting value and the second weighting value in an averaging step.

This achieves the technical advantage that a precise selection of the magnetic field sensors relevant for a position determination is possible. For this purpose, the sensor pattern has a first sensor pattern and a second sensor pattern, each of which is shifted in a first direction relative to the other. Both sensor patterns have an overlap area in which the respective magnetic field sensors are encompassed by both the first sensor pattern and the second sensor pattern. Via the magnetic field sensors of the two sensor patterns, measured values of the rotor magnetic field may be recorded individually and the corresponding rotor may be detected. Via each of the two sensor patterns, a position of the rotor may thus be determined based on the recorded measured values of the respective magnetic field sensors of the sensor pattern. A weighted average of the two positions of the rotor determined by the individual sensor patterns may be generated to determine the position of the rotor. In this way, a precise position determination of the rotor may be achieved, in which two individual position determinations are taken into account considering a weighting.

The weighted average may be a weighted arithmetic average. Alternatively, the weighted average may be a weighted harmonic average. Alternatively, the weighted average may be a weighted geometric average.

According to an embodiment, the sensor pattern further comprises a third sensor pattern and a fourth sensor pattern, wherein the third sensor pattern and the fourth sensor pattern are shifted with respect to each other in a second orientation direction oriented perpendicular to the first orientation direction, and wherein the rotor magnetic field determining step comprises:

measuring third measured values of the rotor magnetic field with the aid of the magnetic field sensors of the third sensor pattern in a third partial rotor magnetic field determining step; and measuring fourth measured values of the rotor magnetic field with the aid of the magnetic field sensors of the fourth sensor pattern in a fourth partial rotor magnetic field determining step, wherein the position determining step comprises:

detecting the rotor and determining a third partial position of the rotor based on the third measured values of the rotor magnetic field measured with the aid of the magnetic field sensors of the third sensor pattern in a third partial rotor detecting step;

detecting the rotor and determining a fourth rotor partial position based on the measured values of the rotor magnetic field measured with the aid of the magnetic field sensors of the fourth sensor pattern in a fourth partial rotor detecting step;

determining a third weighting value of the third sensor pattern and a fourth weighting value of the fourth sensor pattern in the weighting step; and determining the second position of the rotor as a weighted average of the first partial position, the second partial position, the third partial position, and the fourth partial position, taking into account the first weighting value, the second weighting value, the third weighting value, and fourth weighting value in the averaging step.

This has the technical advantage of allowing for further precision of the position determination. The sensor pattern additionally comprises a third sensor pattern and a fourth sensor pattern, each of which is shifted relative to the other in a second direction perpendicular to the first direction. Based on the magnetic field sensors of the four sensor patterns, four individually independent position determinations of the rotor may thus be performed. Via the four individually determined partial positions, a position determination of the rotor in the form of the weighted average may be carried out in the following, taking into account corresponding weighting values. This achieves further precision in the position determination in that a position of the rotor is determined as a weighted average from four individually determined partial positions.

According to an embodiment, the sensor pattern determining step comprises:

determining a first central magnetic field sensor and determining a second central magnetic field sensor and/or determining a third central magnetic field sensor and determining a fourth central magnetic field sensor in a magnetic field sensor determining step, wherein the first central magnetic field sensor and the second central magnetic field sensor and/or the third central magnetic field sensor and the fourth central magnetic field sensor are directly adjacent to the first position and have shortest distances to the first position;

determining a predetermined plurality of first magnetic field sensors surrounding the first central magnetic field sensor and identifying the plurality of first magnetic field sensors as a first sensor pattern in a first identifying step, wherein the first central magnetic field sensor is disposed in a first geometric center of the first sensor pattern;

determining a predetermined plurality of second magnetic field sensors surrounding the second central magnetic field sensor and identifying the plurality of second magnetic field sensors as a second sensor pattern in a second identifying step, wherein the second central magnetic field sensor is located in a second geometric center of the second sensor pattern; and/or determining a predetermined plurality of third central magnetic field sensors surrounding the third magnetic field sensor, and identifying the plurality of third magnetic field sensors as a third sensor pattern in a third identifying step, wherein the third central magnetic field sensor is located in a third geometric center of the third sensor pattern; and determining a predetermined plurality of first magnetic field sensors surrounding the fourth central magnetic field sensor and identifying the plurality of fourth magnetic field sensors as a fourth sensor pattern in a fourth identifying step, wherein the fourth central magnetic field sensor is located in a fourth geometric center of the fourth sensor pattern.

This achieves the technical advantage that a precise determination of the sensor patterns may be provided. In particular, it is achieved that the magnetic field sensors are selected as sensor patterns which are arranged adjacent to the first position of the rotor on the stator module. By selecting the magnetic field sensors adjacent to the first position as the sensor patterns for determining the second position, the second position may be determined based on the measured values of the rotor magnetic field of the magnetic field sensors that have already contributed to the position determination of the first position. Hereby, a simple selection of magnetic field sensors is achieved. Particularly, in the case in which the first and second positions differ only slightly, a precise position determination of the second position may be achieved via the magnetic field sensors adjacent to the first position, since due to the formation of the sensor patterns and the area covered by the sensor patterns, the second position will be positioned within at least one of the sensor patterns.

According to an embodiment, the method further comprises:

determining a first matching value of the first position of the rotor on the stator module with a first positioning of the first sensor pattern on the stator module and determining a second matching value of the first position of the rotor on the stator module with a second positioning of the second sensor pattern on the stator module, and/or determining a third matching value of the first position of the rotor on the stator module with a third positioning of the third sensor pattern on the stator module, and determining a fourth matching value of the first position of the rotor on the stator module with a fourth positioning of the fourth sensor pattern on the stator module in a match determining step, wherein a matching value assumes a value of 1 when the first position of the rotor matches a positioning of a sensor pattern, assumes a value of 0 when the first position of the rotor does not match a positioning of a sensor pattern, and assumes any value between 1 and 0 when the first position of the rotor partially matches a positioning of a sensor pattern; and identifying the first weighting value with the first matching value and identifying the second weighting value with the second matching value and/or identifying the third weighting value with the third matching value and identifying the fourth weighting value with the fourth matching value in a weighting value identifying step.

This achieves the technical advantage that a selection of the magnetic field sensors of the sensor patterns used for position determination of the second position may be carried out on the basis of the magnetic field sensors used for position determination of the first position. This simplifies a selection of the magnetic field sensors relevant for the position determination of the second position. For this purpose, it is ensured that the first to fourth sensor patterns selected for determining the second position occupy areas on the stator module that comprise the first position of the rotor on the stator module. Furthermore, in order to determine the first to fourth weighting values, matches of the first position with the positionings of the first to fourth sensor patterns are determined.

A positioning of a sensor pattern here results from the positioning of the magnetic field sensors of the sensor pattern on the stator module.

In case of a high correspondence of the first position with the positioning of one of the sensor patterns, the partial position determined by the respective sensor pattern is provided with a corresponding high weighting value in the determination of the second position, whereas in case of a low correspondence of the first position with the positioning of a sensor pattern, the partial position determined by the respective sensor pattern is provided with a corresponding low weighting value. The selection of the sensor patterns required to determine the second position may thus be based on the first position of the rotor known at the time of the selection of the sensor patterns. This makes it as simple as possible to select the magnetic field sensors required to determine the second position by taking into account the magnetic field sensors used to determine the first position.

By the shift of the four sensor patterns oriented in two directions perpendicular to each other, it is achieved that in case of a substantial deviation of the second position of the rotor from the first position, the second position is covered by at least one of the four sensor patterns. For the selection of the magnetic field sensors for determining the second position in the form of the four determined sensor patterns, in addition to the known first position of the rotor, it is not necessary to consider the direction of the control path that the rotor travels on the stator module between the first position and the second position.

According to an embodiment, a match of the first position of the rotor on the stator module to a positioning of a sensor pattern is present if a distance of the first position of the rotor with regard to a specified point of the sensor pattern is less than or equal to a first predetermined limit value, and wherein a match of the first position of the rotor on the stator module to a positioning of a sensor pattern is not present, if a distance of the first position of the rotor with regard to the specified point of the sensor pattern is larger than or equal to a second predetermined limit value, and wherein a partial match of the first position of the rotor on the stator module with regard to the positioning of the sensor pattern is provided if the distance of the first position of the rotor to the specified point of the sensor pattern is larger than the first predetermined limit value and less than the second predetermined limit value.

This achieves the technical advantage that the most precise position determination of the rotor is possible. By selecting the specified point of the sensor pattern via a geometric center of the sensor pattern, it may be ensured that, with appropriate selection of the size of the sensor pattern, all magnetic field sensors of the respective sensor pattern are covered by the rotor when the rotor is positioned in the position to be determined, if the positioning of the sensor pattern corresponds completely to the position of the rotor to be determined. In this way, all magnetic field sensors of the selected sensor pattern contribute to the position determination of the rotor, wherein the most precise position determination possible is achieved with a minimum number of magnetic field sensors used.

According to an embodiment, the specified point of the sensor pattern is defined by a geometric center of the sensor pattern.

This has the technical advantage that, if a high degree of correspondence exists between a position of the rotor and a positioning of a sensor pattern, the area of the sensor pattern is completely covered by the rotor and thus all magnetic field sensors of the sensor pattern contribute to the position determination. This may increase the measuring accuracy and thus the precision of the position determination.

According to an embodiment, the method further comprises:

shifting the first sensor pattern and the second sensor pattern along the first orientation direction and determining a shifted first sensor pattern and a shifted second sensor pattern in a shifting step;

measuring further first measured values of the rotor magnetic field with the aid of the magnetic field sensors of the shifted first sensor pattern in a fifth partial rotor magnetic field determining step;

measuring further second measured values of the rotor magnetic field with the aid of the magnetic field sensors of the shifted second sensor pattern in a sixth partial rotor magnetic field determining step;

detecting the rotor and determining a further first partial position of the rotor based on the further first measured values of the rotor magnetic field measured with the aid of the magnetic field sensors of the shifted first sensor pattern in a fifth partial rotor detecting step;

detecting the rotor and determining a further second partial rotor position based on the measured values of the rotor magnetic field measured with the aid of the magnetic field sensors of the shifted second sensor pattern in a sixth partial rotor detecting step;

determining a further first weighting value of the shifted first sensor pattern and a further second weighting value of the shifted second sensor pattern in a further weighting step; and determining a third position of the rotor as a weighted average of the further first partial position and the further second partial position, taking into account the further first weighting value and the further second weighting value in a further averaging step.

This provides the technical advantage that as the rotor progresses on the stator module, a position determining may be carried out continuously along the control path traveled by the rotor by allowing the selected sensor patterns to follow the movement of the rotor.

The shifting step may e.g. be performed if in the weighting step the first weighting value or the second weighting value takes the value 1 and the respective other weighting value takes the value 0.

Since the sensor pattern having weighting value 0 is not taken into account in the position determination or in the weighted average of the four sensor patterns, it does not contribute to determining the position of the rotor in the third position. By shifting the four sensor patterns, it may thus be achieved that all four sensor patterns contribute to determining the position of the rotor in the third position, so that the most precise position determination possible is achieved by taking into account the measured values of the rotor magnetic field recorded with the aid of the magnetic field sensors of the four sensor patterns.

By taking into account the weighting value corresponding to the correspondence between the position of the rotor and the positioning of the four sensor patterns, it is achieved that if there is no correspondence between the last determined position of the rotor and the positioning of a sensor pattern corresponding to a weighting value of 0, a shift of the sensor patterns is caused, since it may be assumed that the third position to be determined will also have no correspondence with the respective sensor pattern having weighting value 0. Hereby, on the basis of the last determined position of the rotor and the resulting correspondence of the last determined position of the rotor with the positionings of the four sensor patterns, it may be caused that the four sensor patterns for position determination of the rotor may be carried along the movement of the rotor along the control path, in order to allow for determining the position of the rotor on the basis of the measured values of the rotor magnetic field recorded with the aid of the magnetic field sensors of the four sensor patterns. Knowledge of the direction of movement of the rotor on the stator module is not necessary for selecting the corresponding sensor patterns for determining a future position of the rotor.

Due to the four sensor patterns arranged in each case in two perpendicularly oriented directions, which may be carried along adapted to the movement of the rotor by corresponding shifting, it may be achieved that even if the direction of movement of the rotor changes between the second position and the future third position, a new determination of the four sensor patterns for determining the position of the rotor in the third position is not necessary. The four sensor patterns may be embodied in such a way that even a change in the direction of movement between the first position or the second position and the third position prevents the rotor from being moved out of the spatial area spanned by the four sensor patterns.

According to an embodiment, the method further comprises:
shifting the third sensor pattern and the fourth sensor pattern along the first orientation direction, and determining a shifted third sensor pattern and a shifted fourth sensor pattern in the shifting step;
measuring further third measured values of the rotor magnetic field with the aid of the magnetic field sensors of the shifted third sensor pattern in a seventh partial rotor magnetic field determining step;
measuring further fourth measured values of the rotor magnetic field with the aid of the magnetic field sensors of the shifted fourth sensor pattern in an eighth partial rotor magnetic field determining step;
detecting the rotor and determining a further third partial position of the rotor based on the further third measured values of the rotor magnetic field measured with the aid of the magnetic field sensors of the shifted third sensor pattern in a seventh partial rotor detecting step;
detecting the rotor and determining a further fourth partial rotor position based on the measured values of the rotor magnetic field measured with the aid of the magnetic field sensors of the shifted fourth sensor pattern in an eighth partial rotor detecting step;
determining a further third weighting value of the shifted third sensor pattern and a further fourth weighting value of the shifted fourth sensor pattern in the further weighting step; and
determining the third position of the rotor as a weighted average of the further first partial position, the further second partial position, the further third partial position and the further fourth partial position, taking into account the further first weighting value, the further second weighting value, the further third weighting value and the further fourth weighting value in the further averaging step.

This has the technical advantage that the four sensor patterns are carried along the movement of the rotor on the stator module. Based on the last determined position and the correspondingly determined weighting values of the individual sensor patterns, a continuous position determination of the rotor along the control path may be achieved without having to consider a direction of movement of the rotor. This makes it possible to achieve the simplest possible position determination of the rotor and a corresponding selection of the magnetic field sensors relevant for position determination, for which a minimum of information regarding the movement of the rotor on the stator module is required.

According to an embodiment, the shifting step comprises:
determining a further first central magnetic field sensor and determining a further second central magnetic field sensor and/or determining a further third central magnetic field sensor and determining a further fourth central magnetic field sensor in a further magnetic field sensor determining step, wherein the further first central magnetic field sensor and the further second central magnetic field sensor and/or the further third central magnetic field sensor and the further fourth central magnetic field sensor are directly adjacent to the second position and have shortest distances to the second position;
determining a predetermined plurality of further first magnetic field sensors surrounding the further first central magnetic field sensor and identifying the plurality of further first magnetic field sensors as a shifted first sensor pattern in a further first identifying step, wherein the further first central magnetic field sensor is arranged in a further first geometric center of the shifted first sensor pattern;
determining a predetermined plurality of further second magnetic field sensors surrounding the further second central magnetic field sensor, and identifying the plurality of further second magnetic field sensors as a second shifted sensor pattern in a further second identifying step, wherein the further second central magnetic field sensor is located in a further second geometric center of the shifted second sensor pattern; and/or
determining a predetermined plurality of further third central magnetic field sensors surrounding the further third magnetic field sensor, and identifying the plurality of further third magnetic field sensors as a shifted third sensor pattern in a further third identifying step, wherein the further third central magnetic field sensor is located in a further third geometric center of the shifted third sensor pattern; and determining a predetermined plurality of further fourth magnetic field sensors surrounding said further fourth central magnetic field sensor and identifying said plurality of further fourth magnetic field sensors as a shifted fourth sensor pattern in a further fourth identifying step, wherein said further fourth central magnetic field sensor is located in a further fourth geometric center of said shifted fourth sensor pattern.

This achieves the technical advantage that a precise determination of the sensor patterns may be provided. In particular, it is achieved that the magnetic field sensors are selected as sensor patterns adjacent to the previously determined second position of the rotor on the stator module. By selecting the magnetic field sensors adjacent to the second position as the sensor patterns for determining the third position, the third position may be determined based on the measured values of the rotor magnetic field of the magnetic field sensors that have already contributed to the position determination of the second position. This achieves a simple selection of magnetic field sensors. In particular, in the case that the second and third positions differ only slightly from each other, a precise position determination of the third position may be achieved via the magnetic field sensors adjacent to the second position, since due to the formation of the sensor patterns and the area covered by the sensor patterns, the third position will be positioned within at least one of the sensor patterns.

According to an embodiment, the further first weighting value corresponds to a matching value between the second position of the rotor and a positioning of the first sensor pattern, wherein the further second weighting value corresponds to a matching value between the second position of the rotor and a positioning of the second sensor pattern, wherein the further third weighting value corresponds to a matching value between the second position of the rotor and a positioning of the third sensor pattern, and wherein the further fourth weighting value corresponds to a matching value between the second position of the rotor and a positioning of the fourth sensor pattern.

This achieves the technical advantage that if the second position does not match the positioning of one of the four sensor patterns, the four sensor patterns are shifted along a predetermined direction. This achieves that the four sensor patterns are moved along the control path during continuous movement without having to take the direction of movement of the rotor into account. This makes it possible to determine the magnetic field sensors required for position determination as simply as possible.

According to an embodiment, the method further comprises:
determining the first position of the rotor on the stator module in a rotor position determining step;
wherein the rotor position determining step comprises:
recording measured values from magnetic field sensors of the sensor module in a measured value determining step;
identifying a first magnetic field sensor of the sensor module, the measured value of which reaches or exceeds a predetermined threshold in a magnetic field sensor identifying step;
recording measured values from magnetic field sensors of the sensor module in the direct vicinity of the first magnetic field sensor in a further measured value determining step;
identifying the magnetic field sensors in the direct vicinity of the first magnetic field sensor, the measured values of which reach or exceed the predetermined limit value in a further magnetic field sensor identifying step;
determining a detection sensor pattern in a detection pattern determining step, wherein a detection sensor pattern comprises identified magnetic field sensors;
detecting the rotor based on the measured values from the magnetic field sensors of the detection sensor pattern in a rotor detecting step; and
identifying the first position of the rotor based on the location of the identified magnetic field sensors stator module in a position identifying step.

This has the technical advantage that a simple detection of a rotor on the stator module may be achieved, in particular during startup or commissioning of the planar drive system and/or in the absence of knowledge of a positioning of the rotor. For this purpose, the magnetic field sensors of the sensor module of the stator module are scanned individually so that e.g. measured values of the individual magnetic field sensors are recorded one after the other until a magnetic field sensor is identified the measured value of which is above a predetermined limit value.

Subsequently, the magnetic field sensors adjacent to the identified magnetic field sensor are scanned. This is used to determine a detection sensor pattern consisting of the magnetic field sensors adjacent to the identified magnetic field sensor, each of which indicates measured values above the predetermined limit value. A measured value exceeding the predetermined limit value is interpreted as a detection of the rotor magnetic field of the rotor to be detected. A position of the rotor may thus be determined via a determination of the positioning of the detection pattern. Particularly when starting up the planar drive system in which an exact position of the rotor is unknown, a simple detection of a rotor positioned on the stator module and a related determination of the respective position of the rotor may thus be achieved.

According to an embodiment, the sensor pattern determining step comprises:
determining a speed of the rotor in a movement of the rotor along the control path in a speed determining step; and
determining the sensor pattern based on the detected speed of the rotor along the control path.

This achieves the technical advantage that a simple determination of the magnetic field sensors required for the determination of the second position is provided. For this purpose, a speed of the rotor is determined in a movement along the control path. The speed here comprises a speed value and a speed direction. Based on the determined speed, it is then possible to predict in which position the rotor will be at a certain point in time. The corresponding sensor pattern may thus be determined based on the predicted position, so that a position determination is made possible by recording corresponding measured values of the rotor magnetic field with the aid of the magnetic field sensors of the determined sensor pattern.

According to an embodiment, the determination of the first position of the rotor on the stator module, the determination of the second position of the rotor on the stator module and the determination of the third position of the rotor on the stator module, as well as the determination of the first partial position, the second partial position, the third partial position, the fourth partial position, the further first partial position, the further second partial position, the further third partial position and the further fourth partial position are carried out by a trained neural network, and the trained neural network being set up to determine a position of the rotor on the stator module on the basis of the measured values of the rotor magnetic field of the magnetic field sensors of the sensor module, taking into account the positioning of the magnetic field sensors of the sensor module in the stator module.

This achieves the technical advantage that the most precise and reliable position determination possible may be provided. The use of a neural network for determining the positions and partial positions of the rotor determined in the various method steps also enables real-time position determination, in which the position of the rotor may be determined within a predetermined time period by the appropriately trained neural network. For this purpose, the measured values recorded with the aid of the magnetic field sensors of the individual sensor patterns are used as input values of the trained neural network. Here, the neural network is set up to determine a position of the rotor on the stator module on the basis of the positionings of the individual magnetic field sensors within the sensor module on the stator module and on the basis of the individual measured values of the magnetic field sensors. For this purpose, the neural network may be trained to a three-dimensional embodiment of the rotor magnetic field, so that measured values of the rotor magnetic field may be assigned to individual areas of the three-dimensional embodiment of the rotor magnetic field by individual magnetic field sensors via the correspondingly trained neural network. By assigning the individual measured values of the various magnetic field sensors of the sensor pattern to the various spatial areas of the rotor magnetic field, it is possible to determine the exact position of the rotor relative to the magnetic field sensors of the sensor pattern. The positioning of the individual magnetic field sensors of the sensor pattern in the stator module then makes it possible to determine the position of the rotor on the stator module.

According to an embodiment, the magnetic field sensors of the sensor module are 1D Hall sensors, 2D Hall sensors, or 3D Hall sensors, wherein a measured value of a magnetic field sensor comprises one, two, or three components of the rotor magnetic field.

This has the technical advantage of enabling precise determination of the rotor magnetic field by recording measured values from the magnetic field sensors of the sensor module for determining the position of the rotor on the stator module. The use of 1D Hall sensors, 2D Hall sensors or 3D Hall sensors allows for detailed measuring of the rotor magnetic field. Hereby an improved position determination may be achieved, in that in particular in connection with the neural network each measured value of the individual magnetic field sensors, over the different components of the rotor magnetic field, which are taken up in each measured value of the magnetic field sensor, a precise assignment between each taken up measured value and a certain spatial area of the rotor magnetic field is made possible. Hereby, a precise mapping between a position of the rotor relative to the magnetic field sensors of the respective sensor pattern and related to this relative to the stator module may be achieved.

According to an embodiment, the first position, the second position, and the third position are identical, wherein controlling the rotor along the steering path comprises holding the rotor in the first position.

This has the technical advantage of enabling comprehensive control of the rotor on the stator module. In addition to the movement of the rotor along the control path, this control includes a constant positioning of the rotor in the first position on the stator module. Via the exact position determination, an exact permanent positioning of the rotor in a position on the stator module may thus be achieved. This is of particular interest at each starting point or end point of a transport path, at which a loading or unloading of the carriage with a good to be transported is carried out.

According to an embodiment, the first position corresponds to a position of the rotor that the rotor assumes at a first position determining time on the stator module, wherein the second position corresponds to a position of the rotor that the rotor assumes at a second position determining time on the stator module, wherein the third position corresponds to a position of the rotor, the third position corresponding to a position of the rotor which the rotor assumes at a third position determining time on the stator module, and wherein the determination of the first position at the first position determining time and/or the determination of the second position at the second position determining time and/or the determination of the third position at the third position determining time is performed in successive control cycles of the controller of the planar drive system.

This achieves the technical advantage that position determinations may be carried out during different control cycles of the cyclically controlled planar drive system. In particular, a position of the rotor may be determined for each control cycle.

A planar drive system comprising at least a controller, a stator module, and a rotor is provided, wherein the rotor may be controlled via a magnetic coupling between a rotor magnetic field of the rotor and a stator magnetic field of the stator module, wherein the stator module comprises a sensor module with a plurality of magnetic field sensors for determining a position of the rotor, and wherein each magnetic field sensor is configured to determine the rotor magnetic field for a spatial region, and wherein the controller is arranged to execute a method according to the invention.

FIG. 1 shows a schematic view of a planar drive system 200 having a stator module 300 and a rotor 400.

According to the embodiment in FIG. 1, the planar drive system comprises a controller 201, a stator module 300, and a rotor 400. The controller 201 is connected to the stator module 300 via a data link 203. The controller 201 comprises a neural network 205 and is arranged to execute a method according to the invention for controlling a planar drive system 200.

For a detailed description of the method according to the invention for controlling a planar drive system 200 and the operation of the neural network 205, reference is made to the description for FIG. 4, FIG. 5, FIG. 7 and FIG. 8.

The stator module 300 has a planar stator surface 303. The planar stator surface 303 is arranged on an upper surface of a stator module housing 305. A rotor 400 is disposed above the stator surface 303. The stator surface 303 is part of a stator assembly 307 for an electric drive of the rotor 400. The stator assembly 307 with the stator surface 303 may be embodied as a printed circuit board. The stator surface 303 is embodied in a square shape.

The rotor 400 may be driven above the stator surface 303 in at least a first direction 507 and a second direction 509. In addition, the rotor 400 may also be driven in a third direction perpendicular to the first direction 507 and the second direction 509. The stator surface 303 comprises a plurality of stator conductors 309, which in the embodiment shown in FIG. 1 are stator conductors 309 that are substantially aligned along the first direction 507. The stator conductors 309 are embodied to carry current and may be energized to drive the rotor 400. A stator conductor gap 311 is provided between the stator conductors 309, by which the stator conductors 309 are electrically isolated from one another. The stator surface 303 is also electrically insulated from the stator conductors 309. A further arrangement of stator conductors may be provided below the stator surface 303, in which the stator conductors are aligned substantially along the second direction 509.

Electronics modules for driving and controlling the rotor 400 are arranged within the stator module housing 305. The electronics modules may e.g. comprise power modules for generating the drive currents and control modules for controlling the power modules and the drive currents. On an underside of the stator module housing 305 opposite to the stator surface 303, connections are arranged for connecting the stator module 300 to a plurality of connection lines. For example, the connection lines may comprise a control line for transmitting control signals for the control modules and a power supply line for supplying electrical power to the power and/or control modules. In particular, electrical energy may be supplied to the power module via the power supply line to generate the drive currents.

The stator module housing 305, the stator assembly 307 and the stator surface 303 are rectangular, in particular square, in the top view of the stator surface 303.

The stator module housing 305 comprises a sectional plane 313. A sensor module may be arranged within the stator module housing 305 at the level of the sectional plane 313.

Figure 2:
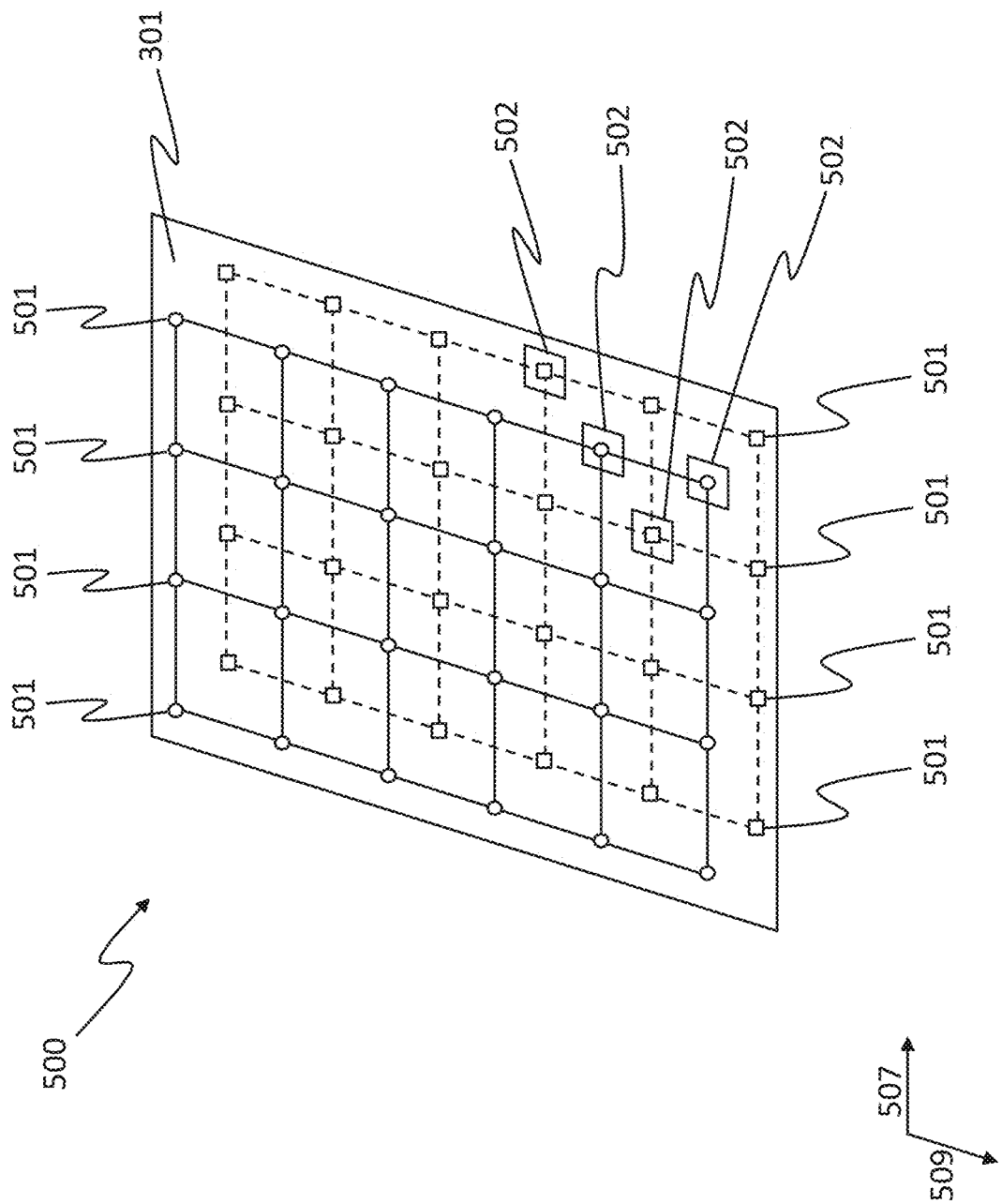
FIG. 2 is a schematic perspective view of a sensor module of the stator module according to an embodiment.

FIG. 2 shows a perspective view of a sensor module 500 for detecting a position of the rotor 400 in the planar drive system 200.

The sensor module 500 is rectangular and comprises a two-dimensional arrangement of magnetic field sensors 501 on a carrier 301 of the stator module 300. Thus, the magnetic field sensors 501 are arranged on the carrier 301. The two-dimensional arrangement of magnetic field sensors 501 has a first periodic grid of magnetic field sensors 501 and a second periodic grid of magnetic field sensors 501. The magnetic field sensors 501 of the first grid are indicated by round symbols, while the magnetic field sensors 501 of the second grid are indicated by square symbols. Alternatively, the sensor module 500 or the arrangement of the magnetic field sensors 501 may be square, parallelogram-shaped, or any other advantageous shape.

The arrangement of magnetic field sensors 501 shown in FIG. 2 is for illustrative purposes only and may differ from the arrangement shown in FIG. 2.

The magnetic field sensors 501 are each set up to determine magnetic fields for a spatial area 502. Measurements of a magnetic field sensor 501 are thus limited to the respective spatial area 502 of the respective magnetic field sensor 501. In the embodiment in FIG. 2, the spatial areas 502 are shown as rectangular or square areas. This is merely due to depictional reasons. The spatial regions 502 of the magnetic field sensors 501 may also have geometrically different spatial extents and e.g. be circular in shape. In particular, the spatial regions 502 may have a point-shaped design, so that point measurements of the respective magnetic fields may be carried out with the aid of the magnetic field sensors 501, in which individual magnetic field sensors 501 exclusively measure field contributions of the respective magnetic fields that are arranged directly at the positions of the respective magnetic field sensors 501.

The carrier 301 is planar so that the magnetic field sensors 501 are arranged in a plane, i.e. in a two-dimensional arrangement.

The magnetic field sensors 501 may be embodied as Hall sensors. In particular, the magnetic field sensors 501 may be embodied as 1D, 2D or 3D Hall sensors, with 3D Hall sensors measuring the magnetic field components in three linearly independent spatial directions. In particular, these spatial directions may include the first direction 507 and the second direction 509 as well as a third direction perpendicular to the first direction 507 and the second direction 509.

The carrier 301 may be embodied as a printed circuit board and/or a circuit board. Thus, the carrier 301 may be provided in a simple way.

Figure 3:
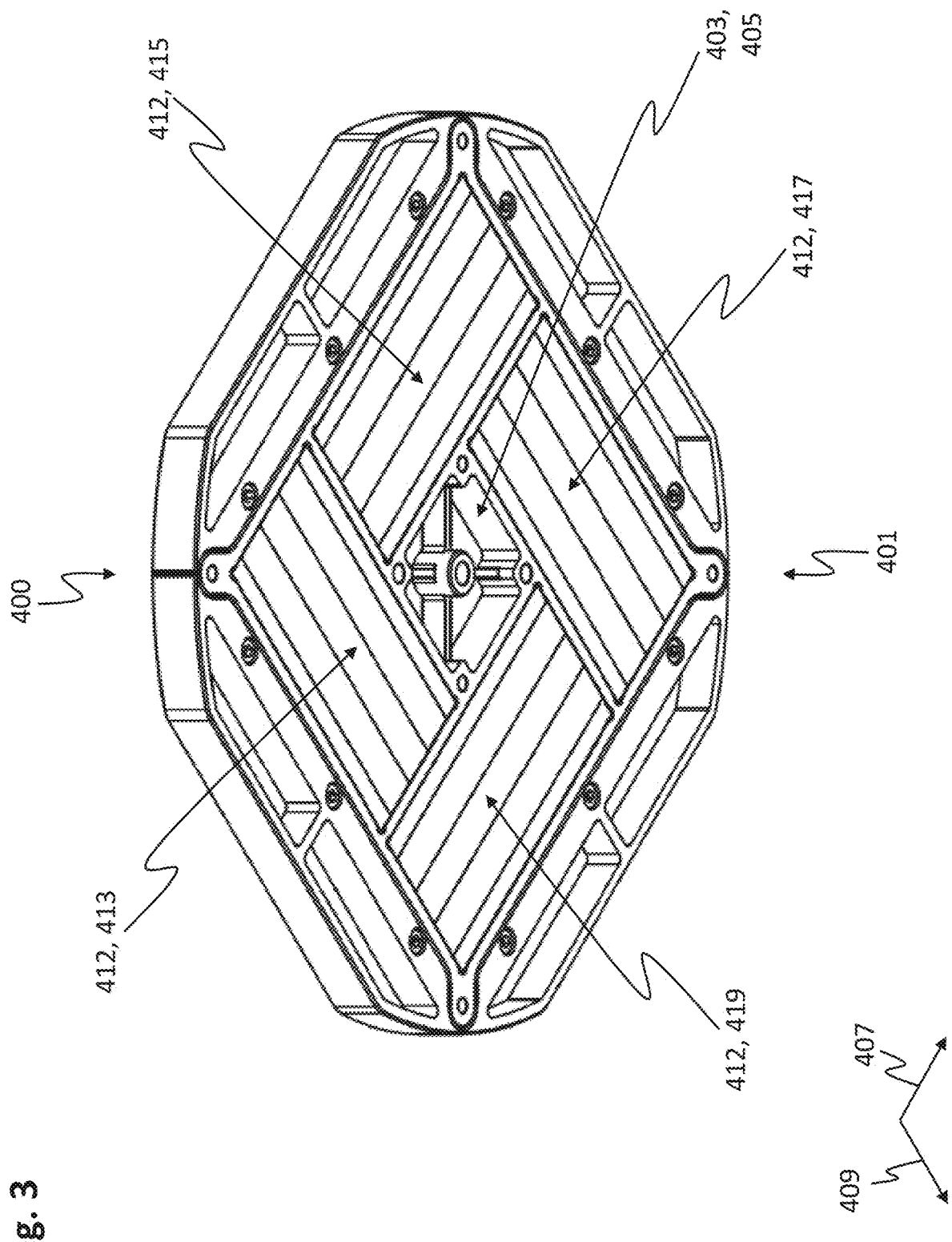
FIG. 3 is a schematic depiction of an underside of a rotor according to a further embodiment.

FIG. 3 shows the rotor 400 of the planar drive system 200 in a bottom view of an underside of the rotor 400. In operation of the planar drive system 200, the underside of the rotor 400 faces the stator surface 303 of the stator module 300. The rotor 400 comprises a magnet arrangement 401 on the underside thereof. The magnet arrangement 401 is rectangular, in particular square, in shape and comprises a plurality of magnets. The underside of the rotor 400 is flat or planar, in particular in the area of the magnets of the magnet arrangement 401. In operation, the underside of the rotor 400 with the magnet arrangement 401 is oriented substantially in parallel to the stator surface 303 and is arranged facing the stator surface 303.

The magnet assembly 401 comprises a first magnet unit 413, a second magnet unit 415, a third magnet unit 417, and a fourth magnet unit 419, generally referred to as the magnet unit 412. The first magnet unit 413 and the third magnet unit 417 each have elongated drive magnets arranged side by side in a first rotor direction 407 and extending along a second rotor direction 409 oriented perpendicular to the first rotor direction 407. The second magnet unit 415 and the fourth magnet unit 419 each have elongated drive magnets arranged side-by-side in the second rotor direction 409 and extending along the first rotor direction 407. In operation, the first and third magnet units 413, 417 serve to drive the rotor 400 in the first rotor direction 407, and the second and fourth magnet units 415, 419 serve to drive the rotor 400 in the second rotor direction 409. In addition, the first magnet unit 413, the second magnet unit 415, the third magnet unit 417, and the fourth magnet unit 419 serve to drive the rotor 400 in a third rotor direction perpendicular to the first rotor direction 407 and the second rotor direction 409.

In the center of the magnet arrangement 401, the rotor 400 comprises a free surface 403 that is not covered by magnets of the magnet arrangement 401. In the area of the free surface 403, the rotor 400 comprises a fastening structure 405. Other components, such as a circuit board, may also be arranged in the free surface 403.

Figure 4:
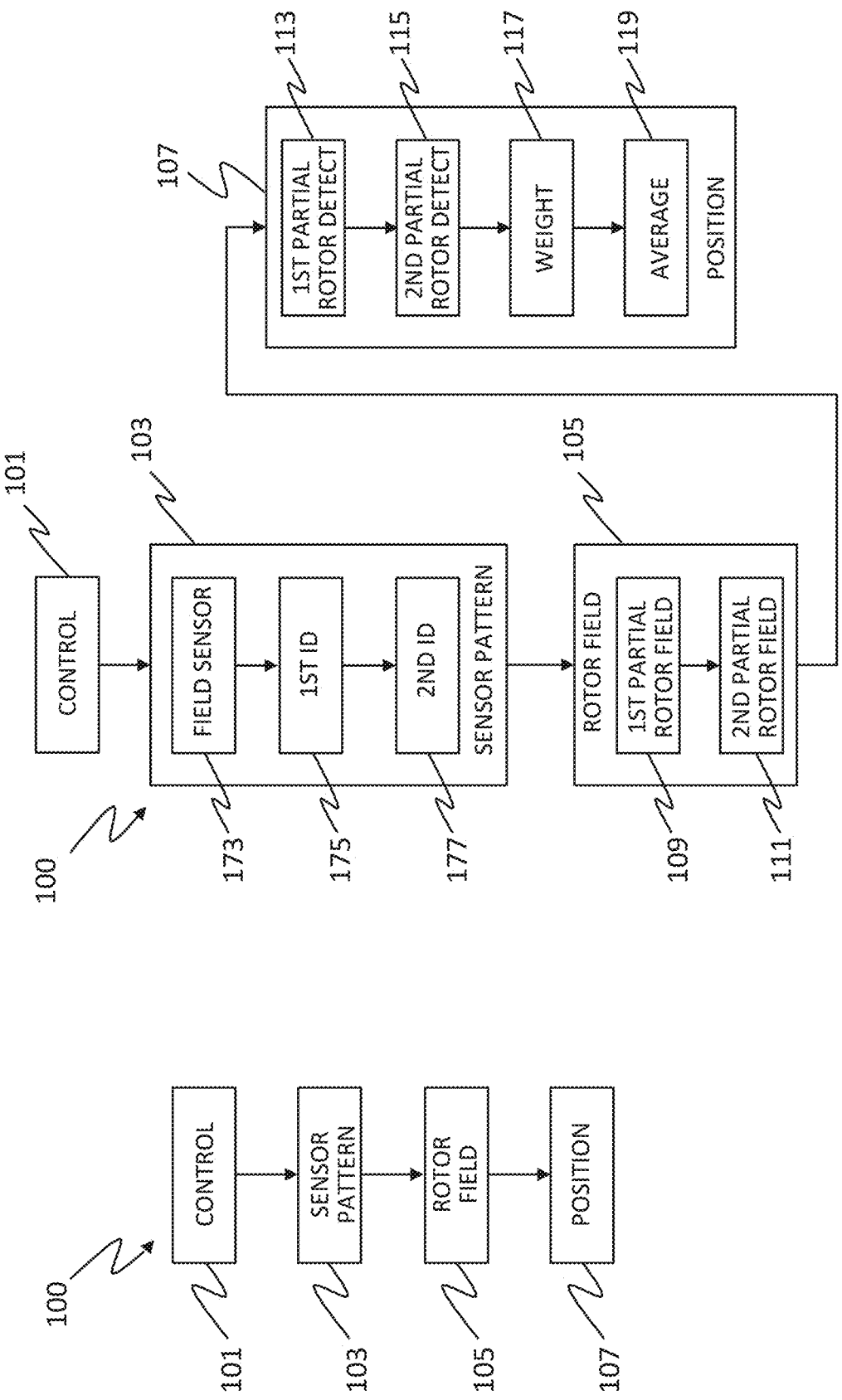
FIG. 4 is a flowchart of a method for controlling a planar drive system according to an embodiment.

FIG. 4 shows a flowchart of a method 100 for controlling a planar drive system 200 according to an embodiment.

The embodiment of the method 100 in FIG. 4 is described with reference to FIG. 5.

The method 100 for controlling a planar drive system 200 is applicable to a planar drive system 200 according to the embodiment shown in FIG. 1. In this case, the planar drive system 200 comprises at least a controller 201, a stator module 300, and a rotor 400, wherein the rotor 400 is controllable via a magnetic coupling between a rotor magnetic field of the rotor 400 and a stator magnetic field of the stator module 300, wherein the stator module 300 comprises a sensor module 500 with a plurality of magnetic field sensors 501 for determining a position of the rotor 400, and wherein each magnetic field sensor 501 is set up to determine the rotor magnetic field for a spatial region.

According to the embodiment shown in FIG. 4, the method 100 first comprises controlling the rotor 400 along a control path SP starting from a first position on the stator module in a controlling step 101.

Here, the control path SP may be any path from the first position P1 across the stator surface 303 of the stator module 300. The first position P1 may be a starting position of a transport path. Alternatively, the first position P1 may be any position of the rotor 400 on the stator module 300. In particular, the control path SP may be a portion of a transport path of the rotor 400 across the stator surface 303 of the stator module.

In a sensor pattern determining step 103, a sensor pattern SM of the magnetic field sensors 501 of the sensor module 500 is subsequently determined. Here, a sensor pattern SM is a subset of the magnetic field sensors 501 of the sensor module, wherein the sensor module 500 comprises at least one magnetic field sensor 501 that is not included in the determined sensor pattern SM. The sensor pattern SM may have any two-dimensional shape and describe a contiguous surface on the stator module 300. A sensor pattern SM may be arbitrarily shifted along the stator surface 303 of the stator module 300. During the shift, the sensor pattern SM comprises different magnetic field sensors 501 of the sensor module 500.

After determining the sensor pattern SM, in a rotor magnetic field determining step 105, a plurality of measured values of the rotor magnetic field are recorded with the aid of the magnetic field sensors 501 of the sensor pattern SM. Here, the magnetic field sensors 501 may be 1D Hall sensors, 2D Hall sensors, or 3D Hall sensors, respectively, so that a measured value of a magnetic field sensor 501 may comprise a plurality of different components of the rotor magnetic field.

Subsequently, in a position determining step 107, the rotor 400 is detected based on the measured values of the rotor magnetic field measured with the aid of the magnetic field sensors 501 of the sensor pattern, and a second position P2 of the rotor 400 on the stator module 300 is determined.

Here, the second position P2 may be an end position of the control path SP of the rotor 400 on the stator module 300. Alternatively, the second position P2 may be identical to the first position P1 and control of the rotor 400 along the control path SP may include holding the rotor 400 in the first position.

The determination of the first position P1 and the determination of the second position P2 of the rotor 400 on the stator module 300 may be carried out for two fixed position determining times, a first position determining time and a second position determining time, such that position determinations of the rotor 400 occur at fixed points in time. For example, a position determination of the rotor 400 at the first position P1 and the second position P2 may be performed in two successive control cycles of a cyclically controlled planar drive system 200. A first position P1 of the rotor 400 is then obtained as a position that the rotor 400 occupies on the stator module 300 at the first position determining time of the first position determination, while a second position P2 of the rotor 400 corresponds to a position that the rotor occupies on the stator module 300 at a second position determining time.

Figure 5:
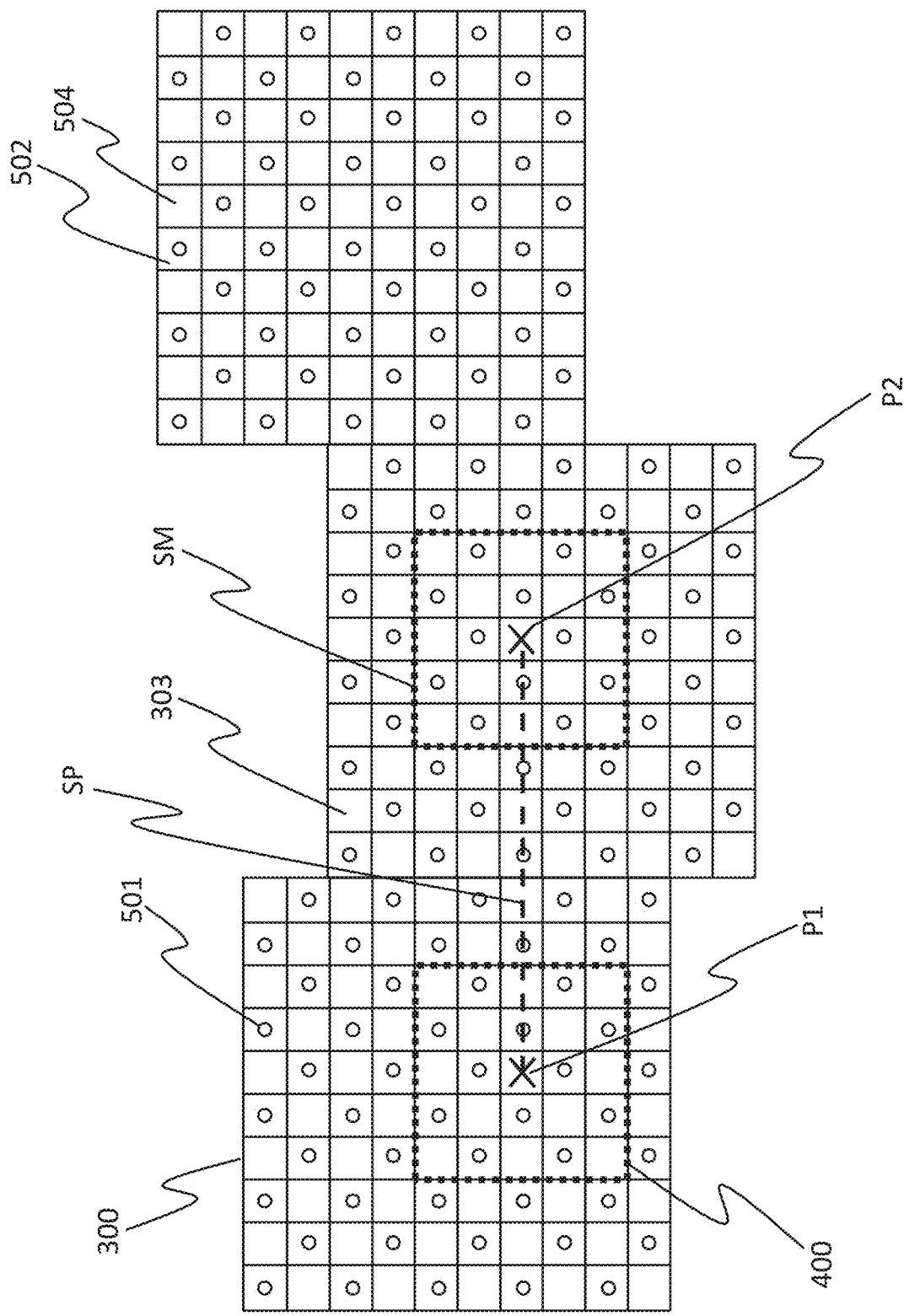
FIG. 5 is a schematic depiction of a rotor on a stator module according to a further embodiment.

FIG. 5 shows a schematic depiction of a rotor 400 on a stator module 300 according to another embodiment.

FIG. 5 shows a graphical illustration of the process 100. In FIG. 5, a stator module 300 is shown. The stator module 300 is divided up into a plurality of square spatial regions 502 and further spatial regions 504. Each spatial region 502 comprises a magnetic field sensor 501. Each further spatial region 504 does not comprise a magnetic field sensor 501. The spatial regions 502 and, in particular, the magnetic field sensors 501 are arranged on the sensor module 300 in a checkerboard fashion such that, in each direction, a spatial region 502 comprising a magnetic field sensor 501 and a further spatial region 504 without a magnetic field sensor 501 are arranged alternately in succession.

Furthermore, FIG. 5 shows a rotor 400 schematically arranged at a first position P1. The rotor 400 is controlled along a control path SP starting from the first position P1 via the stator surface 303 of the stator module 300.

A sensor pattern SM is further arranged around a second position P2. The sensor pattern SM comprises a plurality of magnetic field sensors 501. In the embodiment shown in FIG. 5, the sensor pattern SM is square-shaped and has the same dimensions as the rotor 400. If the rotor 400 is in the second position P2 at the second position determining time, by taking the measured values of the rotor magnetic field with the aid of the magnetic field sensors 501 of the sensor pattern SM in the rotor magnetic field determining step 105 at the second position determining time, the rotor 400 may be detected in the second position P2 and a unique determination of the rotor position in the second position P2 may be performed.

The illustration shown in FIG. 5 is merely exemplary and is not intended to limit the present invention. In particular, the size ratios are not truthfully represented. Specifically, the distance between the first position P1 and the second position P2 may be reduced such that the sensor pattern SM arranged at the second position P2 also covers the first position P1. Furthermore, the control path SP may be arranged arbitrarily and non-linearly.

FIG. 6 shows another flowchart of the method 100 for controlling a planar drive system 200 according to an embodiment.

The embodiment in FIG. 6 is based on the embodiment in FIG. 4 and includes all the method steps shown there. Insofar as these remain unchanged in the embodiment in FIG. 6, a renewed detailed description is dispensed with.

Figure 8:
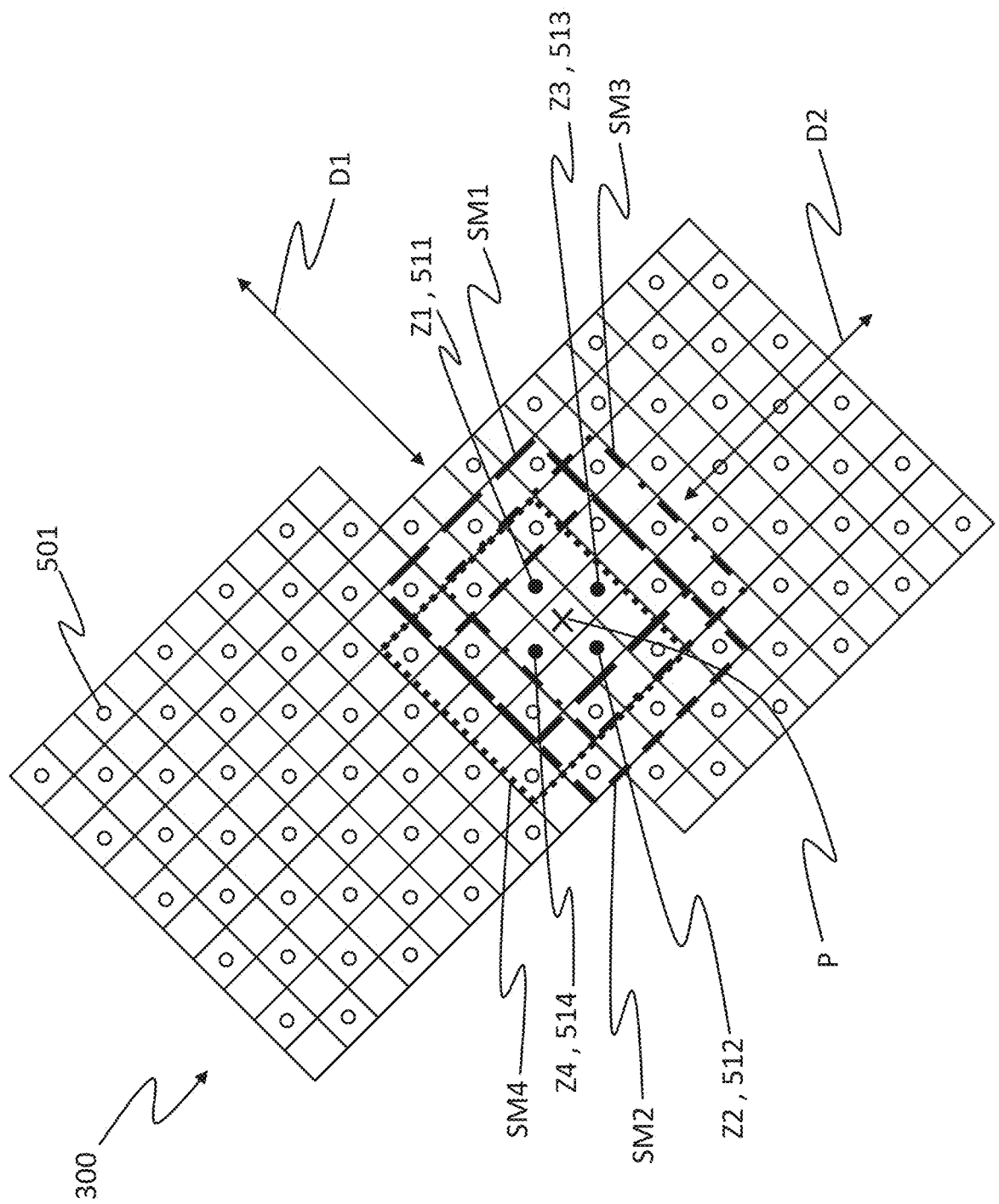
FIG. 8 is a schematic depiction of a stator module with magnetic field sensors selected for a position determination of a rotor according to a further embodiment.

The description of the embodiment of the method 100 in FIG. 6 is made with reference to FIG. 8.

In the embodiment shown in FIG. 6, the sensor pattern SM comprises a first sensor pattern SM1 and a second sensor pattern SM2, each of which is shifted with respect to each other in a first orientation direction D1. The first sensor pattern SM1 and the second sensor pattern SM2 may further comprise an overlapping region in which the respective magnetic field sensors 501 are magnetic field sensors of both the first sensor pattern SM1 and the second sensor pattern SM2.

In the embodiment shown in FIG. 6, the sensor pattern determining step 103 includes a magnetic field sensor determining step 173.

In the magnetic field sensor determining step 173, a first central magnetic field sensor 511 and a second central magnetic field sensor 512 are determined. The first central magnetic field sensor 511 and the second central magnetic field sensor 512 are directly adjacent to the first position P1 and comprise the two shortest distances to the first position P1 among all magnetic field sensors 501 of the sensor module 300.

Furthermore, the sensor pattern determining step 103 comprises a first identifying step 175 and a second identifying step 177.

In the first identifying step 175, a predetermined plurality of first magnetic field sensors surrounding the first central magnetic field sensor 511 is determined, and the determined plurality of first magnetic field sensors is identified as a first sensor pattern SM1, wherein the first central magnetic field sensor 511 is arranged in a first geometric center Z1 of the first sensor pattern SM1 in this case.

Here, the predetermined plurality of magnetic field sensors 501 determines the size of the respective sensor patterns SM or the area of the stator module 300 covered by the sensor patterns SM.

In the second identifying step 177, a predetermined plurality of second magnetic field sensors surrounding the second central magnetic field sensor 512 is determined, and the determined plurality of first magnetic field sensors is identified as a second sensor pattern SM2, wherein the second central magnetic field sensor 512 is disposed in a second geometric center Z2 of the second sensor pattern SM2 at this step.

Thus, to identify the first sensor pattern SM1 and the second sensor pattern SM2, the magnetic field sensors 501 of the sensor module 300 that are adjacent to the first position P1 are selected. The two magnetic field sensors 501 with the smallest distance to the first position P1 are then identified as geometric centers Z of the first and second sensor patterns SM1, SM2. For this purpose, starting from the magnetic field sensors 501 adjacent to the first position P1, the magnetic field sensors 501 adjacent to these magnetic field sensors 501 are selected according to the predetermined plurality of magnetic field sensors 501 forming a sensor pattern SM, such that the magnetic field sensors directly adjacent to the first position form the geometric centers Z of the two sensor patterns SM.

The two first and second sensor patterns SM1, SM2 determined in this way are thus positioned in such a way that the respective first geometric center Z1 of the first sensor pattern SM1 and the second geometric center Z2 of the second sensor pattern SM2 are directly adjacent to the first position P1 and, in particular, are given by the two magnetic field sensors 501 nearest to the first position P1.

In the embodiment shown in FIG. 6, the rotor magnetic field determining step 105 comprises a first rotor magnetic field determining step 109 in which first measured values of the rotor magnetic field are recorded with the aid of the magnetic field sensors 501 of the first sensor pattern SM1.

The rotor magnetic field determining step 105 further comprises a second rotor magnetic field partial determining step 111, in which second measured values of the rotor magnetic field are recorded with the aid of the magnetic field sensors 501 of the second sensor pattern SM2.

Furthermore, the position determining step 107 comprises a first partial rotor detecting step 113, in which the rotor 400 is detected and a first partial position of the rotor 400 is determined based on the first measured values of the rotor magnetic field measured with the aid of the magnetic field sensors 501 of the first sensor pattern SM1. Here, the first partial position of the rotor 400 describes a position of the rotor 400 on the stator module 300 determined by the measurements of the magnetic field sensors of the first sensor pattern SM1.

The position determining step 107 further comprises a second partial rotor detecting step 115, in which, based on the second measured values of the rotor magnetic field recorded with the aid of the magnetic field sensors 501 of the second sensor pattern SM2, the rotor 400 is detected and a second partial position of the rotor 4 on the stator module 300 is determined.

A detection of the rotor 400 with the aid of the magnetic field sensors 501 of the first sensor pattern SM1 or with the aid of the magnetic field sensors 501 of the second sensor pattern SM2 occurs in particular when the rotor 400 is moving along the control path SP at the positioning of the first sensor pattern SM1 and the second sensor pattern SM2 at the second position determining time and at least partially covers the first sensor pattern SM1 or the second sensor pattern SM2. By this partial covering of the spatial regions of the stator surface 303 spanned by the first sensor pattern SM1 and the second sensor pattern SM2 by the rotor 400, the magnetic field sensors 501 of the first sensor pattern SM1 and the second sensor pattern SM2, respectively, are arranged to detect the rotor magnetic field of the rotor 400 by recording corresponding measured values. By a corresponding evaluation of the recorded measured values of the magnetic field sensors 501 of the first sensor pattern and the second sensor pattern, the rotor 400 may thus be detected in the respective positioning of the first sensor pattern SM1 and the second sensor pattern SM2, and a corresponding position of the rotor 400 on the stator module 300 may be determined.

Thus, the first partial position and the second partial position of the rotor 400 correspond to independent position determinations based solely on the first readings from the magnetic field sensors 501 of the first sensor pattern SM1 and the second readings from the magnetic field sensors 501 of the second sensor pattern SM2.

In particular, determining the second position P2 of the rotor 400 on the stator module 300 may be carried out at the predetermined second position determining time. At the second position determining time, the first measured values of the magnetic field sensors 501 of the first sensor pattern SM1 and the second measured values of the magnetic field sensors 501 of the second sensor pattern SM2 are recorded. Depending on the positioning that the rotor 400 assumes on the stator module 300 at this second position determining time, the magnetic field sensors 501 of the first sensor pattern SM1 and the magnetic field sensors 501 of the second sensor pattern SM2 determine different values of the rotor magnetic field of the rotor 400. Based on these values of the rotor magnetic field of the rotor 400, it is then possible to determine the first partial position of the rotor corresponding to the position determination made based on the first measured values of the magnetic field sensors 501 of the first sensor pattern SM1 taken at the second position determining time, and the second partial position of the rotor 400 corresponding to the position determination made based on the second measured values of the magnetic field sensors 501 of the second sensor pattern SM2 taken at the second position determining time.

Subsequently, in a weighting step 117, a first weighting value W1 of the first sensor pattern SM1 and a second weighting value W2 of the second sensor pattern SM2 are determined.

After determining the first and second weighting values W1, W2 in the weighting step 117, the second position P2 of the rotor 400 is determined in an averaging step 119 as a weighted average of the first partial position and the second partial position, taking into account the first weighting value and the second weighting value.

Thus, following the above example, for a positioning of the rotor 400 at the second position determining time corresponding to the positioning of the first sensor pattern SM1, and thus the rotor 400 completely covers the area of the first sensor pattern SM1, and the first weighting value W1 is thus provided with the numerical value 1 and the second weighting value is provided with the numerical value 0, the actual positioning of the rotor 400 in the second position P2 recorded at the second position determining time is determined by determining the weighted average value from the first partial position of the first sensor pattern SM1 and the second partial position of the second sensor pattern SM2, taking into account the first and second weighting values W1, W2 by the first partial position determined with the aid of the magnetic field sensors 501 of the first sensor pattern SM1, while the second partial position determined with the aid of the magnetic field sensors 501 of the second sensor pattern SM2 provided with the weighting value 0 is not taken into account in the determination of the actual position of the rotor 400, i.e. in the weighted average value.

Thus, by using the weighted average taking into account the first and second partial positions determined with the aid of the magnetic field sensors 501 of the first sensor pattern SM1 and the second sensor pattern SM2 using the first and second weighting values W1, W2, a precise position determination of the rotor 400 at the second position determining time in the second position P2 may be determined.

The weighted average may be a weighted arithmetic average. For the first and second partial positions and the first and second weighting values W1, W2, the second position P2 may thus be determined:

$$P2_{arithmetic}=(W1*TP1+W2*TP2)/(W1+W2),$$

wherein TP1 is the first partial position and TP2 is the second partial position.

Alternatively, the weighted average may be a weighted geometric average. For the first and second partial positions and the first and second weighting values W1, W2, the second position P2 may thus be determined:

$$P2_{geometric}=(TP1^{W1}*TP2^{W2})^{1/W},$$

wherein W=W1+W2.

Alternatively, the weighted average may be a weighted harmonic average. For the first and second partial positions and the first and second weighting values W1, W2, the second position P2 may thus be determined:

$$P2harmonic=(W1+W2)/(W1/TP1+W2/TP2).$$

Alternatively, the weighted average may be any other weighted average.

Furthermore, by determining the position of the rotor 400 using the weighted average value of the first and second partial positions, jumps in the position determination of the rotor 400 may be avoided. By the first and second weighting values W1, W2 continuously assuming values between 0 and 1, the first and second sensor patterns SM1, SM2 each contribute a value provided with the respective weighting value as a factor for position determination. In this way, it may be avoided that, in the case of two successive position determinations, these are carried out once exclusively on the measured values of one sensor pattern and subsequently exclusively with measured values of the respective other sensor pattern, which would result in a jump in the position determination of the rotor 400 due to the different positioning of the two sensor patterns. The position determination based on the weighted average value thus allows for a continuous or mathematically constant determination of the rotor position for a rotor 400 moving on the stator module 300.

Figure 7:
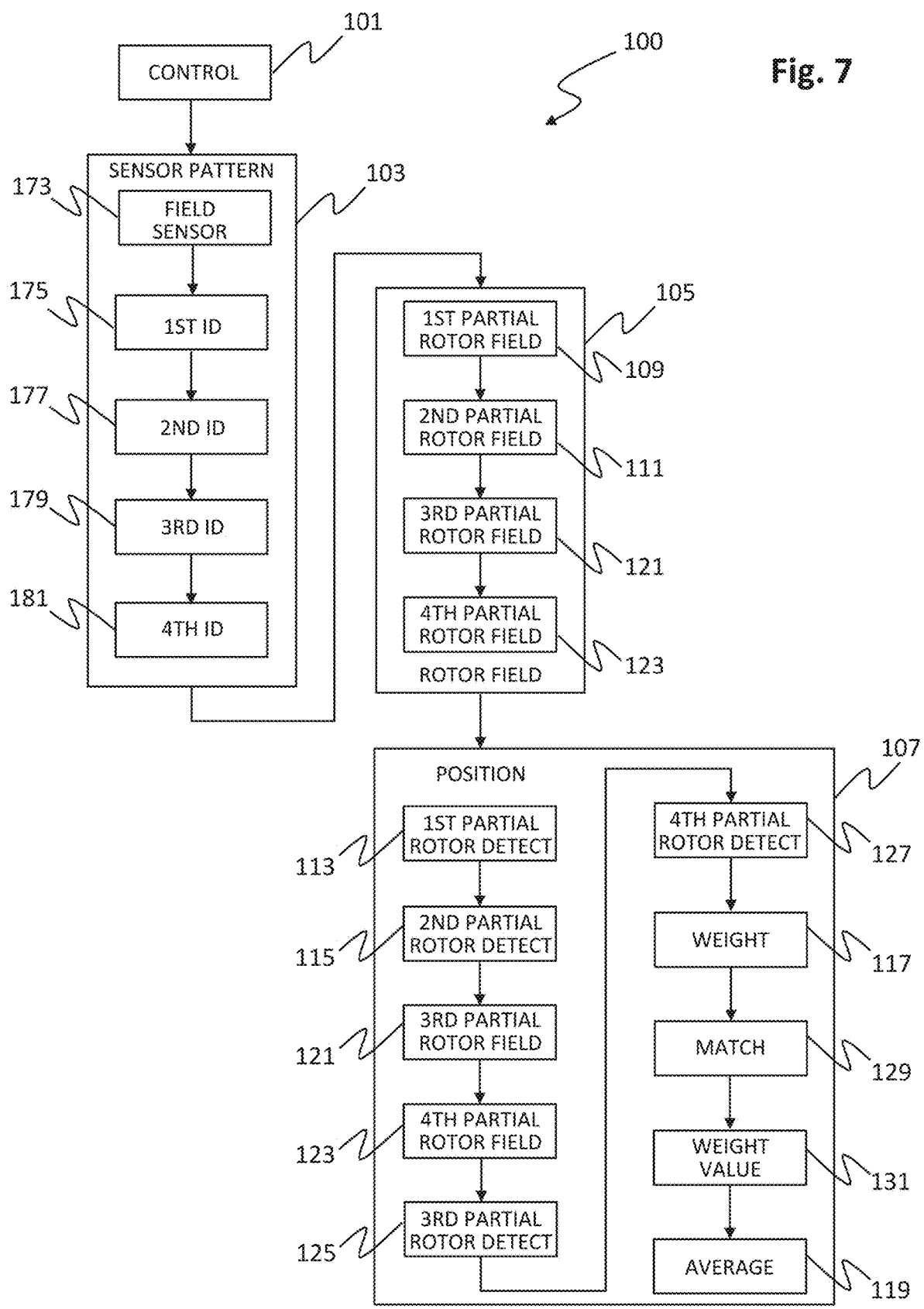
FIG. 7 is a further flowchart of the method for controlling a planar drive system according to a further embodiment.

FIG. 7 shows another flowchart of the method 100 for controlling a planar drive system 200 according to an embodiment.

The embodiment shown in FIG. 7 is based on the embodiment shown in FIG. 6 and comprises all the method steps described there. Insofar as these remain unchanged in the embodiment in FIG. 7, a renewed detailed description is dispensed with.

Figure 9:
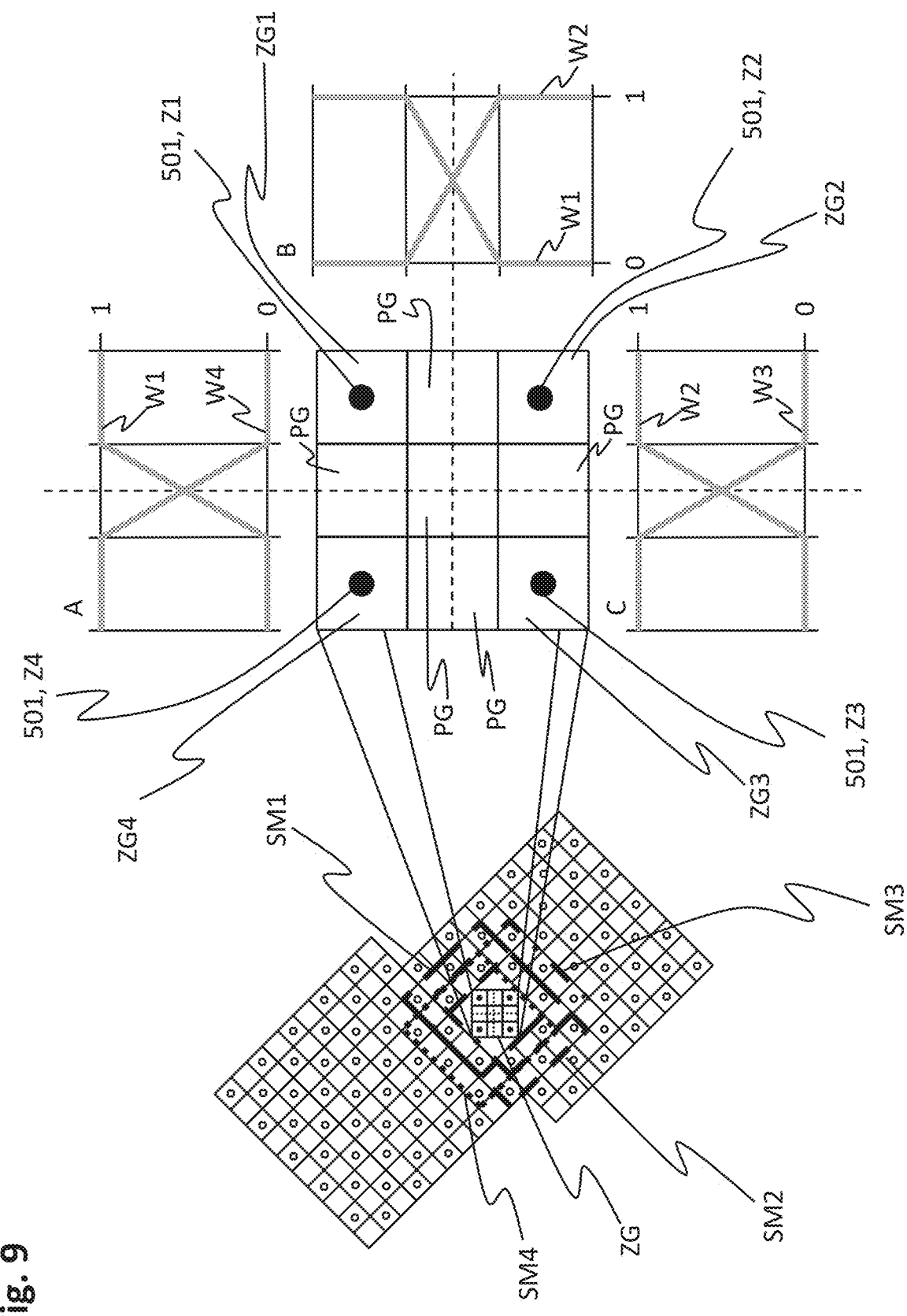
FIG. 9 is a schematic depiction of a stator module with magnetic field sensors selected for a position determination of a rotor according to a further embodiment.

For the following description of the method 100 in the embodiment in FIG. 7, reference is made to the graphical depictions in FIG. 8 and FIG. 9, in which relevant features of the method 100 in the embodiment in FIG. 7 are graphically represented.

Deviating from the embodiment in FIG. 6, in the embodiment in FIG. 7 the sensor pattern SM comprises a third sensor pattern SM3 and a fourth sensor pattern SM4 in addition to the first sensor pattern SM1 and the second sensor pattern SM2. The third sensor pattern SM3 and the fourth sensor pattern SM4 are shifted with respect to each other in a second orientation direction D2 oriented perpendicularly to the first orientation direction D1, and have an overlapping region in which the respective magnetic field sensors 501 arranged there are encompassed by both the third sensor pattern SM3 and the fourth sensor pattern SM4.

In the embodiment in FIG. 7, a third central magnetic field sensor 513 and a fourth central magnetic field sensor 514 are thus additionally determined in the magnetic field sensor determining step 173. The third central magnetic field sensor 513 and the fourth central magnetic field sensor 514 are directly adjacent to the first position P1 and, in addition to the first central magnetic field sensor 511 and the second central magnetic field sensor 512, have the two shortest distances to the first position P1.

Furthermore, the sensor pattern determining step 103 comprises a third identifying step 179 and a fourth identifying step 181.

In the third identifying step 179, a predetermined plurality of third magnetic field sensors surrounding the third central magnetic field sensor 513 is determined, and the determined plurality of third magnetic field sensors is identified as a third sensor pattern SM3, wherein the third central magnetic field sensor 513 is arranged in a third geometric center Z3 of the third sensor pattern SM3 in this case.

In the fourth identifying step 181, a predetermined plurality of fourth magnetic field sensors surrounding the fourth central magnetic field sensor 514 is determined, and the determined plurality of fourth magnetic field sensors is identified as a fourth sensor pattern SM4, wherein the fourth central magnetic field sensor 514 is disposed in a fourth geometric center Z4 of the fourth sensor pattern SM4 in this case.

In this regard, the number of magnetic field sensors 501 encompassed by the individual sensor patterns SM may be identical for the first to fourth sensor patterns SM1, SM2, SM3, SM4. Likewise, the shapes of the sensor pattern SM may be identical.

Thus, in the embodiment shown in FIG. 7, the rotor magnetic field determining step 105 further comprises a third partial rotor magnetic field determining step in which third measured values of the rotor magnetic field are recorded with the aid of the magnetic field sensors 501 of the third sensor pattern SM3.

Further, the rotor magnetic field determining step 105 comprises a fourth partial rotor magnetic field determining step 123 in which fourth measured values of the rotor magnetic field are taken with the aid of the magnetic field sensors 501 of the fourth sensor pattern SM4.

Thus, in the magnetic field determining step 105, four sets of measured values of the rotor magnetic field are taken by the corresponding magnetic field sensors 501 of the first sensor pattern SM1, the second sensor pattern SM2, the third sensor pattern SM3, and the fourth sensor pattern SM4.

In the embodiment shown in FIG. 7, the position determining step 107 further comprises a third partial rotor detecting step 125 in which, based on the third measured value of the rotor magnetic field recorded with the aid of the magnetic field sensors 501 of the third sensor pattern SM3, the rotor 400 is detected and a third partial position of the rotor 400 is determined.

Further, the position determining step 107 includes a fourth partial rotor detecting step 127 in which, based on the fourth measured values of the rotor magnetic field measured with the aid of the magnetic field sensors 501 of the fourth sensor pattern SM4, the rotor 400 is detected and a fourth partial position of the rotor 400 is determined.

Thus, in the position determining step 107, first to fourth partial positions of the rotor 400 are determined at the second position determining time based on the first to fourth measured values of the rotor magnetic field. The first to fourth partial positions correspond to positions of the rotor 400 determined by the respective magnetic field sensors 501 of the first to fourth sensor patterns SM1, SM2, SM3, SM4. Due to the fact that the first to fourth sensor patterns SM1, SM2, SM3, SM4 are shifted with respect to one another along the first orientation direction D1 and the second orientation direction D2, respectively, and thus have different positioning on the sensor module 300 and comprise different magnetic field sensors 501 of the sensor module 500, different areas of the individual sensor patterns may be covered by the rotor 400 when the rotor 400 is positioned.

Through this, different first to fourth measured values of the rotor magnetic field may be measured with the aid of the magnetic field sensors 501 of the different sensor patterns SM1, SM2, SM3, SM4. As a result, different positions of the rotor 400 are determined at the second position determination timing from the individual determinations of the first to fourth partial positions based on the first to fourth measured values of the rotor magnetic field recorded by the corresponding magnetic field sensors 501 of the first to fourth sensor patterns SM1, SM2, SM3, SM4, so that the first partial position determined based on the first measured values of the magnetic field sensors 501 of the first sensor pattern SM1, the second partial position determined on the basis of the second measured values of the magnetic field sensors 501 of the second sensor pattern SM2, the third partial position determined on the basis of the third measured value of the magnetic field sensors 501 of the third sensor pattern SM3, and the fourth partial position determined on the basis of the fourth measured values of the magnetic field sensors 501 of the fourth sensor pattern SM4 differ from each other.

Subsequently, in weighting step 117, a third weighting value W3 and a fourth weighting value W4 are determined in addition to the first weighting value W1 and the second weighting value W2.

The position determining step 107 further comprises a match determining step 129 of determining matches between the first position P1 of the rotor 400 on the stator module 300 with a first positioning of the first sensor pattern SM1, with a second positioning of the second sensor pattern SM2, with a third positioning of the third sensor pattern SM3, and with a fourth positioning of the fourth sensor pattern SM4. The extent to which the first position P1 of the rotor 400 on the stator module 300 is covered by the respective sensor patterns SM1, SM2, SM3, SM4 is thus determined via the matching values between the first position P1 and the respective positioning of the first sensor pattern SM1, the second sensor pattern SM2, the third sensor pattern SM3 and the fourth sensor pattern SM4, respectively.

A positioning of the respective sensor pattern is given here by the corresponding magnetic field sensors 501, which are comprised by the respective sensor pattern, and by their positioning within the sensor module 500.

When the first position P1 of the rotor 400 and a positioning of one of the sensor patterns SM1, SM2, SM3, SM4 coincide, the rotor 400 in the first position P1 covers all magnetic field sensors 501 of the respective sensor pattern SM1, SM2, SM3, SM4.

Furthermore, in the match determining step 129, a matching value is assigned to each sensor pattern SM1, SM2, SM3, SM4. A matching value may here assume any value between 0 and 1, wherein a matching value with the numerical value 1 corresponds to a complete match of the first position P1 with the positioning of a corresponding sensor pattern SM, while a matching value with the numerical value 0 corresponds to a lack of match between the first position P1 and a corresponding sensor pattern SM, while a matching value with a numerical value between 0 and 1 corresponds to a partial match or a partial match of the first position P1 with the respective positioning of the sensor pattern SM.

A match between the position P1 and the positioning of one of the sensor patterns SM1, SM2, SM3, SM4 may e.g. be determined via a distance determination between the first position P1 and the geometric center Z of the respective sensor pattern. For example, for a distance between the first position P1 and a geometric center Z of a sensor pattern SM that is less than or equal to a first limit value, a complete match between the first position P1 and the positioning of the respective sensor pattern SM may be determined. For a distance between the first position P1 and the geometric center Z of the respective sensor pattern SM larger than or equal to a second limit value, e.g. a lack of correspondence between the first position P1 and the respective sensor pattern SM may be determined. For a distance between the first position P1 and the respective sensor pattern SM larger than the first limit value and less than the second limit value, a partial match between the first position P1 and the respective positioning of the sensor pattern SM may thus be determined.

Subsequently, in a weighting value identifying step 131, the first matching value is identified with the first weighting value W1, the second matching value is identified with the second weighting value W2, the third matching value is identified with the third weighting value W3, and the fourth matching value is identified with the fourth weighting value W4.

Hereby, a weighting of the first to fourth partial positions determined on the basis of the first to fourth measured values of the magnetic field sensors 501 of the first to fourth sensor patterns SM1, SM2, SM3, SM4, which were determined for the position determination of the rotor 400 at the second position determining time, may be carried out depending on the correspondence of the first position P1 determined at the first position determining time with the respective positionings of the sensor patterns SM1, SM2, SM3, SM4. In this way, it may be achieved that for the position determination of the rotor 400 at the second position determining time, the partial position of the sensor pattern SM1, SM2, SM3, SM4 is taken into account with a high weighting, the sensor pattern of which has already made a dominant contribution to the determination of the first position at the first position determining time due to high correspondence between the positioning of the sensor pattern and the position of the rotor 400 at the first position determining time.

Thus, the position determination based on the readings of the magnetic field sensors 501 of the sensor pattern SM1, SM2, SM3, SM4, which is positioned with regard to the first position P1 with high correspondence and the magnetic field sensors 501 of which have already made the dominant contribution to the position determination of the first position P1, makes the dominant contribution to the position determination of the rotor 400 in the second position P2.

Thus, when the rotor changes from the first position P1 at the first position determining time along the control path SP to the second position P2 at the second position determining time, the measured values of the magnetic field sensors 501 for determining the position of the rotor 400 in the second position P2 that have already preferably contributed to determining the position of the rotor 400 in the first position P1 are taken into account. This may achieve that in case of small changes between the first position P1 and the second position P2, no new selection of the magnetic field sensors 501 to be used for position determination of the rotor 400 in the second position P2 has to be made. Instead, the magnetic field sensors 501 to be used for determining the position of the rotor 400 in the second position P2 are those that were already used for determining the position of the rotor 400 in the first position P1. In this case, those magnetic field sensors 501 with increased contribution are taken into account via the corresponding weighting values that already provided the dominant contribution for determining the position of the rotor 400 in the first position P1 and contributed the most accurate position determination.

This is of particular interest in the case in which there is only such a short period of time between the first position determining time and the second position determining time that a rotor 400 is not able to cover a distance on the stator module 300 that leads the rotor 400 out of the area covered by the sensor patterns SM1, SM2, SM3, SM4. This is particularly the case when the first position determining time and the second position determining time are defined by two consecutive control cycles of the controller 201 of the planar drive system.

Subsequently, in the averaging step 119, the first partial position is taken into account with the corresponding first weighting value W1, the second partial position is taken into account with the corresponding second weighting value W2, the third partial position is taken into account with the corresponding third weighting value W3, and the fourth partial position is taken into account with the corresponding fourth weighting value W4 for determining the position of the rotor 400 in the second position P2 in the form of a weighted average. The actual position of the rotor 400 at the second position determining time is determined in this case via the weighted average value from the first to fourth partial positions taking into account the corresponding first to fourth weighting values, so that in the position determination the partial position with the highest weighting value is taken into account dominantly and the respective partial positions with the lowest weighting value are taken into account negligibly.

As already mentioned above for the first sensor pattern SM1 and the second sensor pattern SM2, in this embodiment, as well, the weighted average may be a weighted arithmetic average. For the first, second, third and fourth partial positions and the first, second, third and fourth weighting values W1, W2, W3, W4, the second position P2 may thus be determined:

$$P2_{arithmetical} = (W1*TP1 + W2*TP2 + W3*TP3 + W4*TP4)/(W1 + W2 + W3 + W4),$$

wherein TP1 is the first partial position, TP2 is the second partial position, TP3 is the third partial position, and TP4 is the fourth partial position.

Alternatively, the weighted average may be a weighted geometric average. For the first, second, third and fourth partial positions and the first, second, third and fourth weighting values W1, W2, W3, W4, the second position P2 may thus be determined:

$$P2_{geometric} = (TP1^{W1} * TP2^{W2} * TP3^{W3} * TP4^{W4})^{1/W},$$

wherein W=W1+W2+W3+W4.

Alternatively, the weighted average may be a weighted harmonic average. For the first, second, third and fourth partial positions and the first, second, third and fourth weighting values W1, W2, W3, W4, the second position P2 may thus be determined:

$$P2_{harmonic} = (W1 + W2 + W3 + W4)/(W1/TP1 + W2/TP2 + W3/TP3 + W4/TP4).$$

Alternatively, the weighted average may be any other weighted average.

FIG. 8 shows a schematic diagram of a stator module 300 having magnetic field sensors 501 selected for a position determination of a rotor 400 according to another embodiment.

FIG. 8 shows a graphical depiction of the sensor patterns used in the method 100 according to the embodiment in FIG. 7.

In FIG. 8, a first sensor pattern SM1, a second sensor pattern SM2, a third sensor pattern SM3 and a fourth sensor pattern SM4 are arranged around a position P. The position P is a position that the rotor 400 occupies at any position determining time.

The first sensor pattern SM1 and the second sensor pattern SM2 are each shifted with respect to each other along the first orientation direction D1. The third sensor pattern SM3 and the fourth sensor pattern SM4 are each shifted relative to one another by the second orientation direction D2, which is oriented perpendicular to the first orientation direction D1.

The first sensor pattern SM1 has a first geometric center Z1. The second sensor pattern SM2 has a second geometric center Z2. The third sensor pattern SM3 has a third geometric center Z3. The fourth sensor pattern SM4 has a fourth geometric center Z4. The first to fourth geometric centers Z1, Z2, Z3, Z4 are respectively defined with the aid of the magnetic field sensors 501 closest to the position P. The first geometric center Z1 is provided by the first central magnetic field sensor 511. The second geometric center Z2 is provided by the second central magnetic field sensor 512. The third geometric center Z3 is provided by the third central magnetic field sensor 513. The fourth geometric center Z4 is provided by the fourth central magnetic field sensor 514.

The sensor patterns SM1, SM2, SM3, SM4 are each embodied in a square shape and have an identical number of magnetic field sensors 501. For example, the sensor patterns SM1, SM2, SM3, SM4 may correspond to the shape of the rotor 400. Alternatively, the sensor patterns SM1, SM2, SM3, SM4 may have any two-dimensional shape.

To determine the position P of the rotor 400, according to the method 100, at a corresponding position determining time, first measured values are recorded with the aid of the magnetic field sensors 501 of the first sensor pattern SM1, second measured values are recorded with the aid of the magnetic field sensors 501 of the second sensor pattern SM2, third measured values are recorded with the aid of the magnetic field sensors 501 of the third sensor pattern SM3, and fourth measured values of the rotor magnetic field of the rotor 400 are recorded with the aid of the magnetic field sensors 501 of the fourth sensor pattern SM4. Based on the first to fourth measured values, a first partial position, a second partial position, a third partial position, and a fourth partial position are determined, each corresponding to a position determination of the rotor 400 based on the measured values of the magnetic field sensors 501 of the respective sensor patterns SM1, SM2, SM3, SM4.

An actual position P of the rotor 400 is subsequently determined by a weighted average of the first to fourth partial positions, taking into account the corresponding first through fourth weighting values.

The first to fourth weighting values may be determined based on a match between a previously determined position and the positioning of the respective sensor pattern.

Analogously, the correspondence of the position P shown in FIG. 8 with the respective positioning of the first to fourth sensor patterns SM1, SM2, SM3, SM4 may be taken into account in a position determination at a subsequent, later position determining time. In FIG. 8, the position P shown is arranged at exactly the same distance from the first geometric center Z1 of the first sensor pattern SM1, from the second geometric center Z2 of the second sensor pattern SM2, from the third geometric center Z3 of the third sensor pattern SM3, and from the fourth geometric center Z4 of the fourth sensor pattern SM4. Thus, for a subsequent position determination of a future position, the measured values of the magnetic field sensors 501 of the first sensor pattern SM1, the second sensor pattern SM2, the third sensor pattern SM3 and the fourth sensor pattern SM4 would contribute with equal weighting.

The positioning of the four sensor patterns relative to the depicted position P shown in FIG. 8 is merely exemplary.

FIG. 9 shows a further schematic depiction of a stator module 300 having magnetic field sensors 501 selected for a position determination of a rotor 400 according to another embodiment.

FIG. 9 shows a graphical depiction illustrating the determination of first to fourth weighting values W1, W2, W3, W4 based on a match or distance between a position P and a geometric center Z of a corresponding sensor pattern SM.

For this purpose, a central weighting area ZG and a peripheral weighting area PG are determined for each geometric center. Thus, a square-shaped first central weighting area ZG1 is arranged around the first geometric center Z1 of the first sensor pattern SM1. Around the second geometric center Z2 of the second sensor pattern SM2, a square-shaped second central weighting region ZG2 is arranged. A square third central weighting area ZG3 is arranged around the third geometric center Z3 of the third sensor pattern SM3. A square fourth central weighting area ZG4 is arranged around the fourth geometric center Z4 of the fourth sensor pattern SM4.

Between the first central weighting area ZG1 of the first geometric center Z1 and the second central weighting area ZG2 of the second geometric center Z2, a likewise square-shaped peripheral weighting area PG is arranged. Between the second central weighting area ZG2 of the second geometric center Z2 and the third central weighting area ZG3 of the third geometric center Z3, a square-shaped peripheral weighting area PG is again arranged. Between the third central weighting area ZG3 of the third geometric center Z3 and the fourth central weighting area ZG4 of the fourth geometric center Z4, a square-shaped peripheral weighting area PG is again arranged. Between the fourth central weighting area ZG4 of the fourth geometric center Z4 and the first central weighting area ZG1 of the first geometric center Z1, a square-shaped peripheral weighting area PG is again arranged. A peripheral weighting area PG is also arranged in the center of the first to fourth central weighting areas ZG1, ZG2, ZG3, ZG4.

FIG. 9 also shows three curves of the first weighting value W1, the second weighting value W2, the third weighting value W3 and the fourth weighting value W4. The depicted curves of the weighting values W1, W2, W3, W4 show the dependence of the weighting values W1, W2, W3, W4 on the correspondence of the positioning of the respective sensor pattern SM with a previously determined position P.

Thus, the first curve A shows the curve of the first weighting value W1 and the fourth weighting value W4 depending on the distance of the corresponding position P to the first geometric center Z1 and to the fourth geometric center Z4. According to the curve A, a weighting distribution of the first weighting value W1 and the fourth weighting value W4 is made in such a way that, when the position P is positioned within the first central weighting area ZG1 of the first geometric center Z1, the first weighting value W1 assumes the value 1 and the fourth weighting value W4 assumes the value 0. When the position P is positioned within the fourth central weighting area ZG4 of the fourth geometric center Z4, the first weighting value W1 has the value 0 and the fourth weighting value W4 has the value 1. When the position P is positioned within the peripheral weighting area PG between the first central weighting area ZG1 and the fourth central weighting area ZG4, both the first weighting value W1 and the fourth weighting value W4 have a linear curve between the value 0 and the value 1. A curve of the weighting values within the peripheral weighting area PG is formed linearly in FIG. 9. However, a different curve is also possible.

Analogously, in curve B a dependence of the first weighting value W1 and the second weighting value W2 on a positioning of a position P within the first central weighting area ZG1 and the second central weighting area ZG2, respectively, is shown. When the position P is positioned within the first central weighting area ZG1, the first weighting value W1 takes the value 1, while the second weighting value W2 takes the value 0. For a positioning of the position P within the second central weighting area ZG2, the first weighting value W1 assumes the value 0, while the second weighting value W2 assumes the value 1. For a positioning of the position P within the peripheral weighting area PG, both the first weighting value W1 and the second weighting value W2 have a linear curve.

Analogously, the curve C represents a dependence of the second weighting value W2 and the third weighting value W3 on a positioning of a position P. If the position P is positioned in the second central weighting area ZG2, the second weighting value W2 has the value 1, while the third weighting value W3 has the value 0. When a position P is positioned within the third central weighting area ZG3, the second weighting value W2 has the value 0, while the third weighting value W3 has the value 3. Within the peripheral weighting range PG, both the second weighting value W2 and the third weighting value W3 have a linear curve.

Analogously to the curves A, B, C, the third weighting value W3 and the fourth weighting value W4 show a dependency on a positioning within the central weighting areas. When a position P is positioned within the third central weighting area ZG3, the third weighting value W3 has a value of 1, while the fourth weighting value W4 has a value of 0. When a position P is positioned within the fourth central weighting area ZG4, the third weighting value W3 has a value of 0, while the fourth weighting value W4 has a value of 1.

As an alternative to the linear curve of the weighting values W1, W2, W3, W4 within the peripheral weighting areas PG, the weighting values W1, W2, W3, W4 may have any desired curve.

Curves between the first geometric center Z1 and the third geometric center Z3, as between the second geometric center Z2 and the fourth geometric center Z4 are embodied analogously to the curves shown in FIG. 9 in that a linear curve of the respective weighting values occurs in the centrally arranged peripheral weighting area PG between the first to fourth central weighting areas ZG1, ZG2, ZG3, ZG4. For a position P within the central peripheral weighting area PG between the first to fourth central weighting areas ZG1, ZG2, ZG3, ZG4, the first to fourth weighting values W1, W2, W3, W4 assume a value different from 0, so that all four sensor patterns SM1, SM2, SM3, SM4 contribute to the position determination.

According to the dependencies of the values of the weighting values W1, W2, W3, W4 to the positionings of a previous position P relative to the geometric centers Z1, Z2, Z3, Z4 of the sensor patterns SM1, SM2, SM3, SM4 shown in the curves, a corresponding weighting of the first to fourth partial positions determined with the aid of the magnetic field sensors 501 of the respective sensor patterns SM1, SM2, SM3, SM4, which are included in the determination of the position to be determined in accordance with the weighted average, so that the magnetic field sensors 501 of the sensor pattern SM1, SM2, SM3, SM4, the geometric center Z1, Z2, Z3, Z4 of which has the smallest distance from the previously determined position P are preferably taken into account for position determination. The weighting performed in this way ensures that the magnetic field sensors 501 that have already made the dominant contribution to the previous position are given preferential consideration.

Figure 10:
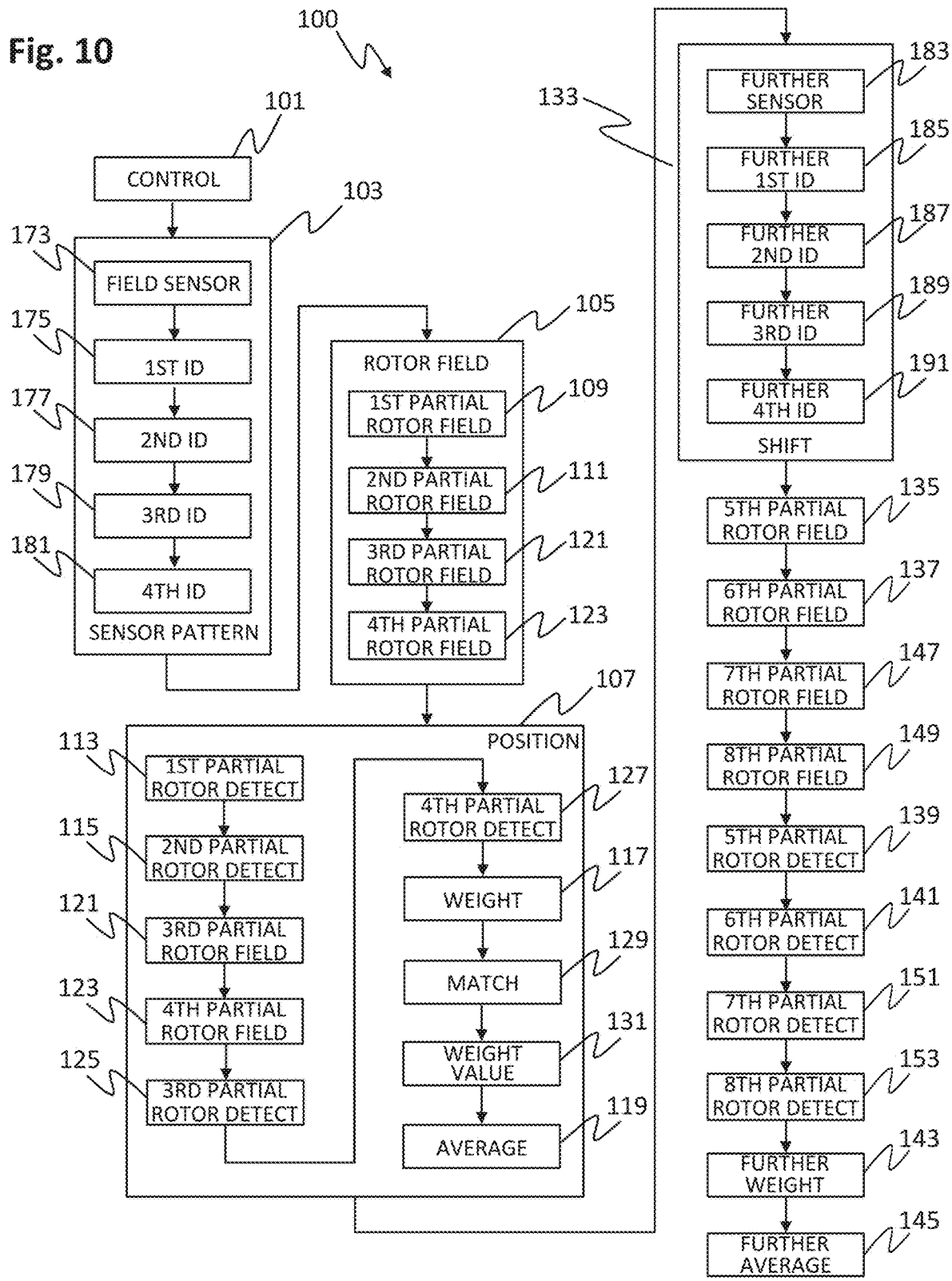
FIG. 10 is a further flowchart of the method for controlling a planar drive system according to a further embodiment.

FIG. 10 shows another flowchart of the method 100 for controlling a planar drive system 200 according to an embodiment.

The embodiment in FIG. 10 is based on the embodiment in FIG. 7 and comprises all the method steps described there. Insofar as these remain unchanged in the embodiment in FIG. 10, no further detailed description is provided.

In the embodiment shown in FIG. 10, the method further comprises a shifting step 133 in which the first sensor pattern SM1, the second sensor pattern SM2, the third sensor pattern SM3, and the fourth sensor pattern SM4 are shifted along the first orientation direction D1.

A shift may be carried out if in weighting step 117 the first weighting value W1 or the second weighting value W2 assumes the value 1 and the respective other weighting value assumes the value 0. If a weighting value assumes the value 0, no correspondence existed between the position P and the positioning of the respective sensor pattern for the determination of a preceding position P. For a subsequent position determination at a later position determining time, e.g. in a subsequent control cycle, of a further position, the partial position determined on the basis of the measured values of the magnetic field sensors 501 of the respective sensor pattern SM does not contribute to the weighted average and thus to the determination of the position.

For a further position determination at a later position determining time, the respective sensor patterns SM must be shifted to ensure that all four sensor patterns SM1, SM2, SM3, SM4 may contribute to the position determination.

A shift of a sensor pattern changes the positioning of the respective sensor pattern on the stator module 300. A shape or configuration of the sensor pattern may remain unchanged by the shift. By shifting a sensor pattern, it is achieved that other magnetic field sensors 501 of the sensor module 500 are comprised by the shifted sensor pattern.

In order to shift the sensor patterns SM, first of all a further magnetic field sensor determining step 183 determines a further first central magnetic field sensor, a further second central magnetic field sensor, a further third central magnetic field sensor, a further fourth central magnetic field sensor, wherein the further first central magnetic field sensor, the further second central magnetic field sensor, the further third central magnetic field sensor and the further fourth central magnetic field sensor are directly adjacent to the second position P2 and are the magnetic field sensors 501 with the shortest distances to the second position P2.

In another first identifying step 185, a predetermined plurality of further first magnetic field sensors surrounding the further first central magnetic field sensor is determined, and the plurality of further first magnetic field sensors is identified as a shifted first sensor pattern, wherein the further first central magnetic field sensor is disposed in a further first geometric center of the shifted first sensor pattern.

In a further second identifying step 187, a predetermined plurality of further second magnetic field sensors surrounding the further second central magnetic field sensor is determined, and the plurality of further second magnetic field sensors is identified as a shifted second sensor pattern, wherein the further second central magnetic field sensor is disposed in a further second geometric center of the shifted second sensor pattern.

In a further third identifying step 189, a predetermined plurality of further third magnetic field sensors surrounding the further third central magnetic field sensor is determined, and the plurality of further third magnetic field sensors is identified as a shifted third sensor pattern, wherein the further third central magnetic field sensor is located in a further third geometric center of the shifted third sensor pattern.

In a further fourth identifying step 191, a predetermined plurality of further fourth magnetic field sensors surrounding the further fourth central magnetic field sensor is determined, and the plurality of further fourth magnetic field sensors is identified as a shifted fourth sensor pattern, wherein the further fourth central magnetic field sensor is disposed in a further fourth geometric center of the shifted fourth sensor pattern.

The shift of the sensor patterns SM is thus realized by centering the shifted sensor patterns on the second position P2 and using these shifted sensor patterns to determine the third position.

In a fifth partial rotor magnetic field determining step 135, further first measured values of the rotor magnetic field are recorded with the aid of the magnetic field sensors 501 of the shifted first sensor pattern at a third position determining time.

In a sixth partial rotor magnetic field determining step 137, at the third position determining time, further second measured values of the rotor magnetic field are recorded with the aid of the magnetic field sensors 501 of the shifted second sensor pattern.

In a seventh partial rotor magnetic field determining step 147, further third measured values of the rotor magnetic field are measured with the aid of the magnetic field sensors 501 of the shifted third sensor pattern at the third position determining time.

In an eighth partial rotor magnetic field determining step 149, additional fourth measured values of the rotor magnetic field are measured with the aid of the magnetic field sensors 501 of the shifted fourth sensor pattern at the third position determining time.

In a fifth partial rotor detecting step 139, based on the further first measured values of the rotor magnetic field measured with the aid of the magnetic field sensors 501 of the shifted first sensor pattern, the rotor 400 is detected and a further first partial position of the rotor 400 is determined.

In a sixth partial rotor detecting step 141, based on the further second measured values of the rotor magnetic field measured with the aid of the magnetic field sensors 501 of the shifted second sensor pattern, the rotor 400 is detected and a further second partial position of the rotor 400 is determined.

In a seventh partial rotor detecting step 151, based on the further third measured values of the rotor magnetic field measured with the aid of the magnetic field sensors 501 of the shifted third sensor pattern, the rotor 400 is detected and a further third partial position of the rotor 400 is determined.

In an eighth partial rotor detecting step 153, based on the further fourth measured values of the rotor 400 measured with the aid of the magnetic field sensors 501 of the shifted fourth sensor pattern, a further fourth partial position of the rotor 400 is detected.

In a further weighting step 143, a further first weighting value of the shifted first sensor pattern, a further second weighting value of the shifted second sensor pattern, a further third weighting value of the shifted third sensor pattern, and a further fourth weighting value of the shifted fourth sensor pattern are determined.

In analogy to the procedure shown in FIG. 9, the further first to fourth weighting values are determined by determining distances of the further first to fourth geometric centers of the shifted first to fourth sensor patterns to the second position P2.

In a further averaging step 145, based on the further first partial position, the further second partial position, the further third partial position, the further fourth partial position, and taking into account the further first weighting value, the further second weighting value, the further third weighting value, and the further fourth weighting value, a third position of the rotor 400 is determined as a weighted average.

Thus, by shifting the first to fourth sensor patterns SM1, SM2, SM3, SM4 along any direction, positions P that the rotor 400 occupies on the stator module 300 at the position determining times and that are arranged along the control path SP of the rotor 400 may be determined by corresponding position determinations by corresponding measurements of the magnetic field sensors 501 of the respective shifted first to fourth sensor patterns. In this regard, a partial position is determined for each sensor pattern based on the measured values of the respective magnetic field sensors 501 for the respective position determining time. These partial positions are provided with corresponding weighting values based on the extent to which the respective sensor pattern before the shift matches the previously determined position of the rotor 400. On the basis of such determined partial positions taking into account the corresponding weighting values, a corresponding position determination may thus be performed in the form of a weighted average value for any position of the rotor.

When shifting the individual sensor patterns, the arrangement of the first to fourth sensor patterns SM1, SM2, SM3, SM4 shown in FIG. 8 and FIG. 9, respectively, may be maintained so that the respective arrangement is shifted simultaneously by a corresponding amount in the respective shift direction.

Figure 11:
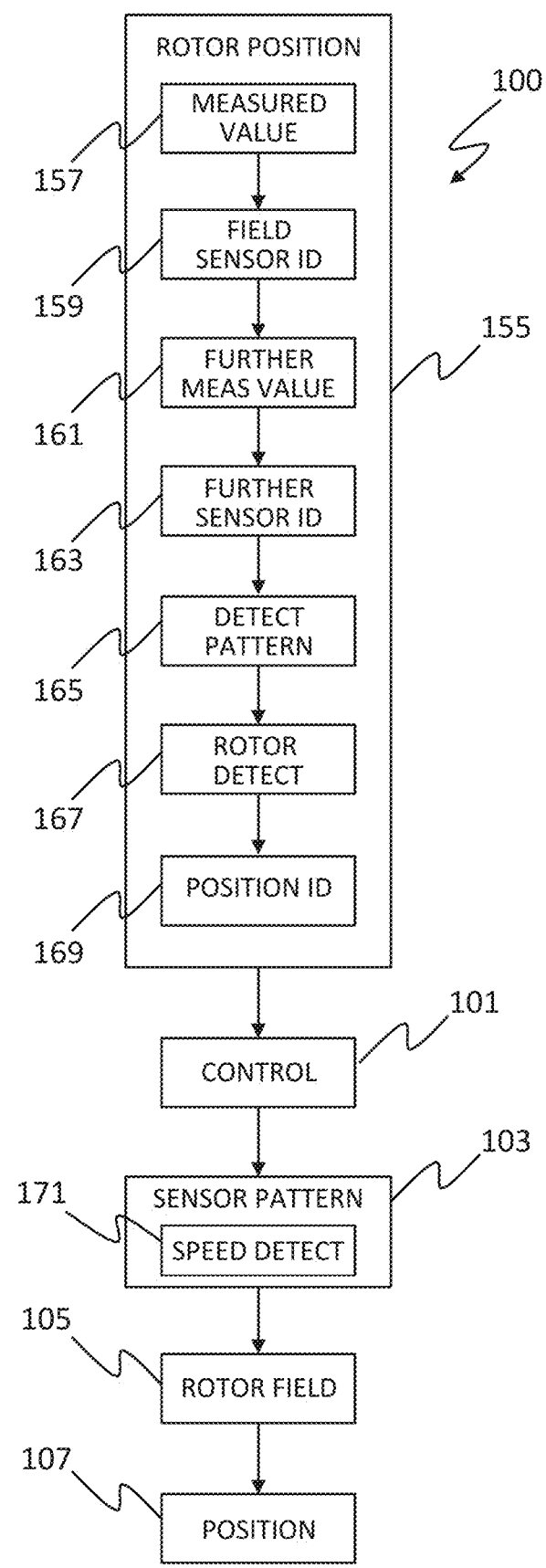
FIG. 11 is a further flowchart of the method for controlling a planar drive system according to a further embodiment.

FIG. 11 shows a further flowchart of the method 100 for controlling a planar drive system 200 according to an embodiment.

The embodiment in FIG. 11 is based on the embodiment in FIG. 4 and comprises all the method steps described there. Insofar as these remain unchanged in the embodiment in FIG. 11, a renewed detailed description is dispensed with.

The embodiment in FIG. 11 further comprises a rotor position determining step 155, in which the first position P1 is determined.

Here, the rotor position determining step 155 comprises a measured value determining step 157 in which measured values of the magnetic field sensors 501 of the sensor module 500 are recorded. For this purpose, e.g. each magnetic field sensor 501 of the sensor module 500 may record a corresponding measured value or a plurality of measured values in turn.

As soon as one of the magnetic field sensors 501, each of which records one or more measured values in sequence, has a measured value that reaches or exceeds a predetermined limit value, this magnetic field sensor is identified in a magnetic field sensor identifying step 159. Exceeding the predetermined limit value of a measured value of a magnetic field sensor 501 of the sensor module 500 may be interpreted here as a detection of a rotor magnetic field of a rotor 400 on the stator module 300.

After identifying the first identified magnetic field sensor 503 in the magnetic field sensor identifying step 159, further measured values of magnetic field sensors of the sensor module 500 in the direct vicinity of the first identified magnetic field sensor 503 are recorded in a further measured value determining step 161. In the further measured value determining step 161, only the directly adjacent magnetic field sensors 505 of the first identified magnetic field sensor 503 are scanned or corresponding measured values are recorded by the latter. Further magnetic field sensors 501 of the sensor module 500 are not taken into account in the further measurement value determining step 161.

In a further magnetic field sensor identifying step 163, the magnetic field sensors 505 adjacent to the first identified magnetic field sensor 503, the measured values of which reach or exceed the predetermined threshold are identified.

In a detection pattern determining step 165, a detection sensor pattern DSM is determined, wherein the detection sensor pattern DSM comprises the identified magnetic field sensors 505.

Subsequently, based on the readings from the identified magnetic field sensors 505 of the detection pattern DSM, the rotor 400 is detected.

After detecting the rotor 400, a position identifying step 169 identifies the first position P1 of the rotor 400 based on the positioning of the identified magnetic field sensors 505 in the stator module 300.

Thus, in order to identify the first position P1, the magnetic field sensors 501 of the sensor module 500 are scanned consecutively by taking a measured value from each sensor 501 of the sensor module 500. Once a magnetic field sensor 501 is identified that has a measured value that is larger than or equal to a predetermined threshold value, all neighboring magnetic field sensors 501 that are located in close proximity to the identified magnetic field sensor 503 are scanned by taking measured values of the neighboring magnetic field sensors 505. The neighboring magnetic field sensors 505, the measured values of which meet or exceed the predetermined threshold are identified as such. Based on the identified magnetic field sensors 505, a detection pattern DSM is determined that describes a contiguous range of magnetic field sensors 501 that have each detected a measured value that reaches or exceeds the previously determined limit value.

Measured values from the magnetic field sensors 501 that meet or exceed the previously determined threshold are identified as detecting the rotor magnetic field of a rotor 400 placed on the stator module 300. By determining the positioning of the detection sensor pattern DSM based on the positionings of the identified magnetic field sensors 505 of the detection sensor pattern DSM, the rotor 400 is detected at the positioning of the detection sensor pattern DSM and a first position P1 of the rotor 400 in the positioning of the detection sensor pattern DSM is determined. This may achieve detection of rotors on the stator module 300 for which an exact position on the stator module 300 is unknown. In particular, this may be performed during startup of the planar drive system 200 in which exact positions of individual rotors 400 on the stator module 300 are unknown.

In the embodiment shown in FIG. 11, the sensor pattern determining step 103 for determining the second position P2 further comprises a speed determining step 171. In the speed determining step 171, a speed of the rotor 400 in a movement of the rotor 400 along the control path SP between the first position P1 and the second position P2 is determined. Here, the speed may include a speed value and a speed direction. Based on the speed, it may thus be determined for a predetermined point in time in which area on the stator module 300 the rotor 400 will be located. Based on this determination, a corresponding sensor pattern SM may be selected to determine the rotor 400 in the corresponding second position P2 based on the measured values of the respective magnetic field sensors 501 of the sensor pattern SM determined taking into account the speed of the rotor.

The embodiment shown in FIG. 11 represents an alternative solution for sensor pattern determination and thus an alternative embodiment of the method 100. In particular, the rotor position determining step 155 and the partial steps comprised thereby may also be combined with the embodiments of FIGS. 4, 6, 7 and 10.

The position determination of the individual positions or partial positions by recording corresponding measured values of the magnetic field sensors 501 of the individual sensor patterns SM at corresponding position determining times, as illustrated in the embodiments described above, may be carried out by a correspondingly trained neural network 205. In this regard, the appropriately trained neural network 205 is configured to determine a positioning of the rotor relative to the respective magnetic field sensors 501 based on the respective measured values of the magnetic field sensors of the respective sensor patterns SM. Based on the positionings of the individual magnetic field sensors 501 in the stator module 300, a positioning of the rotor 400 relative to the stator module 300 may thus be determined. For this purpose, the appropriately trained neural network 205 may assign each measured value of the rotor magnetic field with the aid of the magnetic field sensors 501 of the corresponding sensor module to a three-dimensional spatial region of the rotor magnetic field of the rotor 400. Based on the assignments of the individual measured values of the magnetic field sensors 501 to individual spatial regions of the rotor magnetic field, a unique assignment of the rotor 400 to the respective magnetic field sensors 501 of the sensor pattern SM may thus be made.

Position determinations according to the above method steps of the method 100 may in particular be carried out in each control cycle of the automation system 200. By using neural networks, a position determination according to the above method steps of the method 100 may be performed in real time, so that a position determination of the rotor in a position to be determined on the stator module may be performed in each control cycle. For example, an individually trained neural network may be used for each rotor 400 of the planar drive system 200.

Figure 12B:
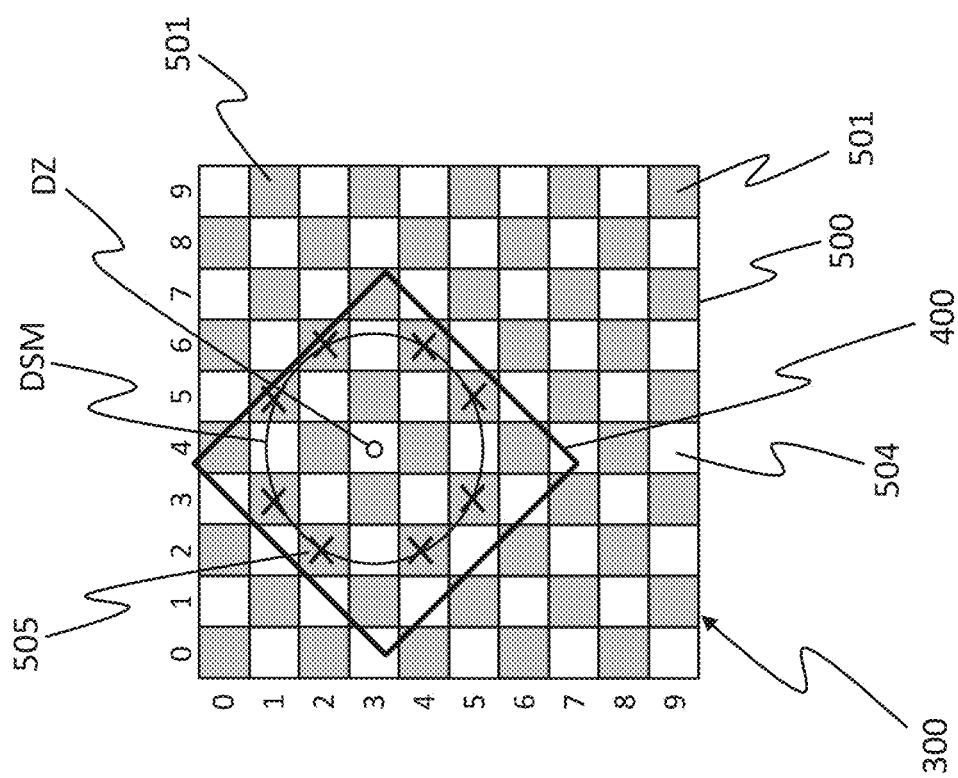
FIGS. 12A and 12B are schematic depictions of a stator module with magnetic field sensors selected for a position determination of a rotor according to a further embodiment.
Figure 12A:
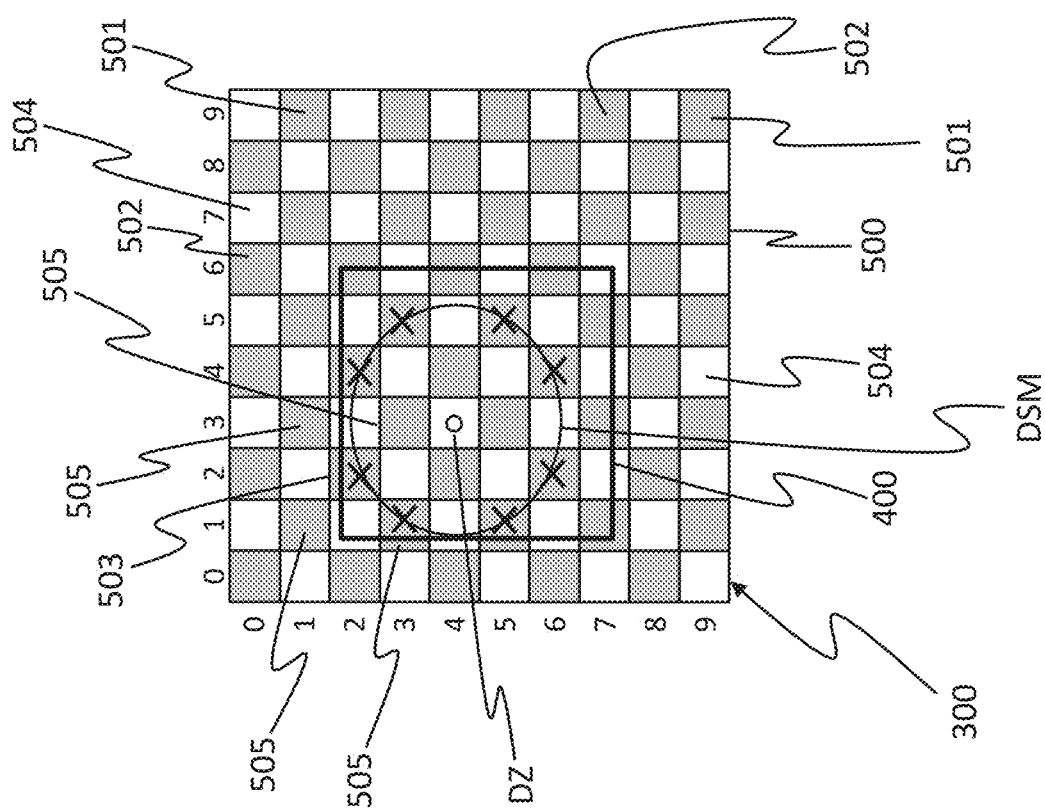

FIGS. 12A and 12B show a schematic diagram of a stator module 300 with magnetic field sensors selected for a position determination of a rotor 400 according to a further embodiment.

In FIGS. 12A and 12B, a graphical depiction of the position determination of the first position according to the embodiment of the method 100 in FIG. 11 is illustrated. FIGS. 12A and 12B here only differ in an orientation of the rotor 400 on the stator module 300.

In FIGS. 12A and 12B, a stator module 300 is shown with a plurality of magnetic field sensors 501 arranged on the stator module 300 in a checkerboard arrangement in which alternating spatial regions 502 with magnetic field sensors 501, shown in gray in FIGS. 12A and 12B, and further spatial regions 504 without magnetic field sensors, shown in white in FIGS. 12A and 12B, are arranged. FIGS. 12A and 12B further show a rotor 400 in a square shape.

To determine the position of the first position P1 according to the embodiment in FIG. 11, the magnetic field sensors 501 of the columns marked 0 and 1 are scanned consecutively and measured values of the individual magnetic field sensors 501 are recorded. In column 2, the magnetic field sensor 503 identified first is subsequently identified as the first magnetic field sensor of the stator module 300 having a measured value that is above the predetermined limit value. The identified magnetic field sensor 503 is covered by the rotor 400 in the first position and thus measures the rotor magnetic field of the rotor 400. Subsequently, the directly adjacent magnetic field sensors 505 of the identified magnetic field sensor 503 are scanned. Of these directly adjacent magnetic field sensors 505, the magnetic field sensor 505 located in column 4 and in row 2, as well as the magnetic field sensor 505 located in column 1 and in row 3, has a value above the predetermined limit value, since both magnetic field sensors are covered by the rotor 400.

Subsequently, further magnetic field sensors in the direct vicinity of the neighboring magnetic field sensors 505 identified in this way are scanned and the magnetic field sensors 501 that are covered by the rotor 400 and thus have a measured value above the predetermined limit value are identified. This is then used to determine the detection sensor pattern DSM, which in FIGS. 12A and 12B is determined with the aid of the magnetic field sensors marked with the cross or the spatial regions 502 surrounding them. In FIGS. 12A and 12B, the detection sensor pattern DSM is circular in shape. A positioning of the detection sensor pattern DSM may be determined by a positioning of the detection center Z of the detection sensor pattern DSM. By determining the detection sensor pattern DSM, the rotor 400 may be detected in its respective position. By positioning the detection sensor pattern DSM, which corresponds to the positioning of the detection center Z of the detection sensor pattern DSM, a position of the rotor 400 may be determined and identified with the first position P1.

In FIGS. 12A and 12B, the method for detecting the rotors 400 positioned on the stator module 300 is described for only one rotor 400. For detecting further rotors 400 positioned on the stator module 300, the method steps described for FIG. 11 are continued. Hereby, all rotors 400 positioned on the stator module 300 may be detected and their positions may be determined.

The present method 100 may be applied to a plurality of different rotors 400 on a stator module or on a plurality of stator modules 300 coupled to one another.

A detection of rotors 400 of the planar drive system 200 according to the rotor position determining step 155 may in particular be carried out when the planar drive system 200 is started up to perform a first position determination of the rotors 400 of the planar drive system 200, based on which a control of the rotors 400 may be carried out. Alternatively, a detection of rotors 400 of the planar drive system 200 may be carried out according to the rotor position determining step 155 after the planar drive system 200 has been interrupted in operation, e.g. due to a malfunction, and is accessed again. Alternatively, a detection of rotors 400 of the planar drive system 200 according to the rotor position determining step 155 may be performed when a new rotor 400 is introduced into the system. Alternatively, a detection of rotors 400 of the planar drive system 200 according to the rotor position determining step 155 may be performed at any time, e.g. when an erroneous position determination of one or more rotors 400 has been determined.

Figure 13:
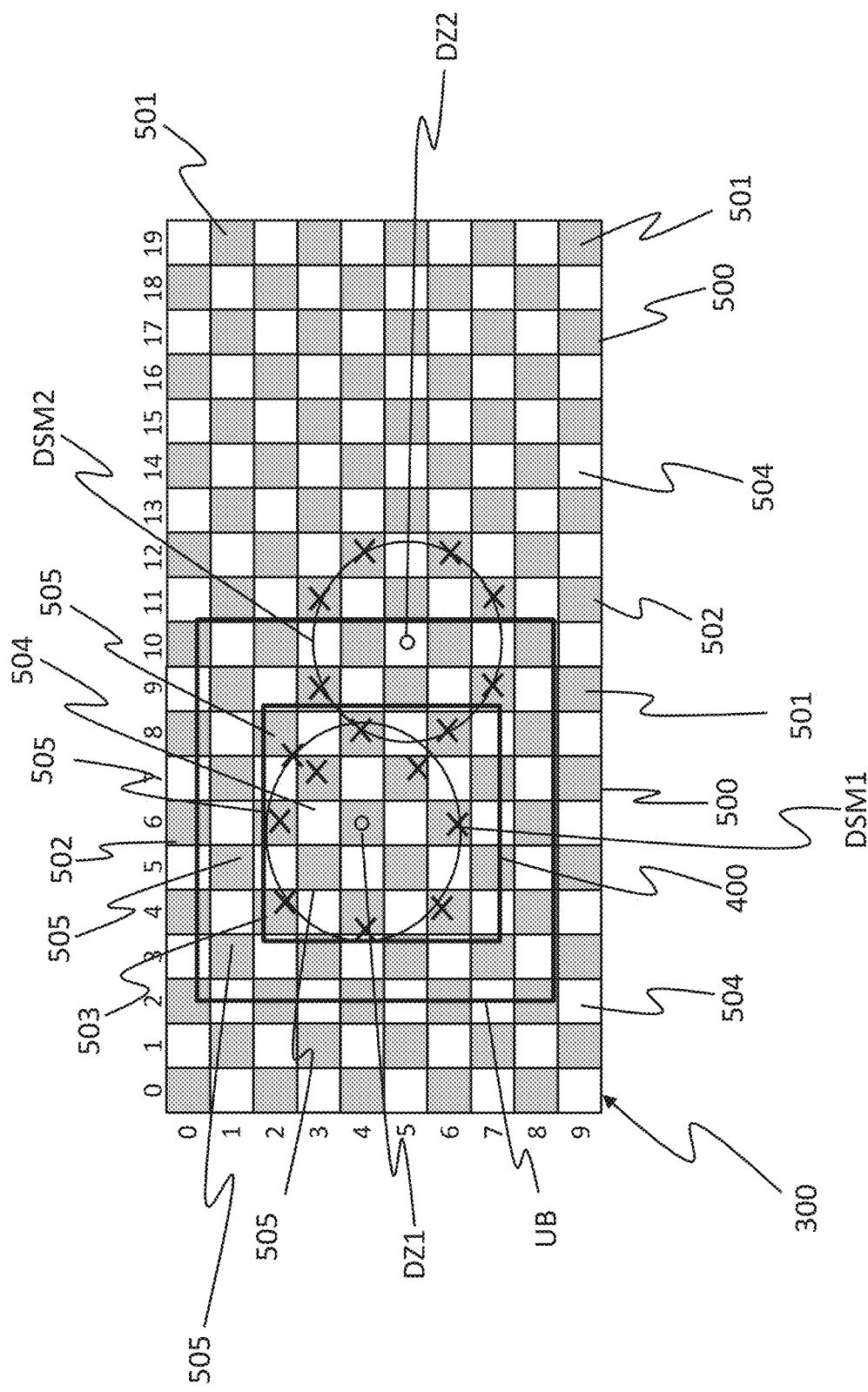
FIG. 13 is a further schematic depiction of a stator module with magnetic field sensors selected for a position determination of a rotor according to a further embodiment.

FIG. 13 shows a further schematic depiction of a stator module 300 with magnetic field sensors selected for a position determination of a rotor 400 according to another embodiment.

FIG. 13 illustrates the case in which, after a rotor 400 has been detected according to the method 100 described with respect to FIGS. 12A and 12B, additional rotors are to be detected.

In FIG. 13, this is illustrated by a rotor 400 detected by a first detection sensor pattern DSM1 with a first detection center DZ1 as determined above.

When re-executing the rotor position determining step 155, a second detection sensor pattern DSM2 with a second detection center DZ2 was detected according to the partial steps of the rotor position determining step 155.

To detect a plurality of rotors, the rotor position determining step 155 may be performed multiple times with all of the comprehensive partial steps as described above.

In order to avoid that already detected rotors 400 are detected again when the rotor position determining step 155 is executed several times, a surrounding area UB is defined around the position of the already detected rotor 400. The surrounding area UB, which in the embodiment in FIG. 13 is arranged around the first detection center DZ1 of the first detection sensor pattern DSM1, describes an area that is blocked for renewed detections of further rotors. Measured values of magnetic field sensors 501 arranged in this area are interpreted as measured values of the rotor magnetic field of the already detected rotor 400 when measured again. The surrounding area UB results from the dimensions of the rotors 400, which have the effect that central points of the rotors 400, which are identified in the rotor position determining step 155 with the detection centers DZ1, must be spaced apart from each other by a minimum distance, since a smaller distance would correspond to the two rotors 400 being arranged on top of each other.

Thus, when the rotor position determining step 155 is executed again, it is determined for a second detection sensor pattern DSM2 having a corresponding second detection center DZ2, each determined according to the rotor position determining step 155, whether the second detection center DZ2 is located within the surrounding area UB of the detected rotor 400. If this is the case, as shown in FIG. 13, the measured values recorded with the aid of the magnetic field sensors 501 of the second detection sensor pattern DSM2 are discarded or assigned to the rotor magnetic field of the already detected rotor 400.

In the case in which the one further detection center is located outside of the surrounding area UB, this further detection sensor pattern is assigned a further rotor which is detected thereby and for which a position corresponding to the respective detection center of the further detection sensor pattern is assigned.

This invention has been described with respect to exemplary examples. It is understood that changes can be made and equivalents can be substituted to adapt these disclosures to different materials and situations, while remaining with the scope of the invention. The invention is thus not limited to the particular examples that are disclosed, but encompasses all the examples that fall within the scope of the claims.

TABLE 1

List of reference numerals: 1-191

100 Method for controlling a planar drive system
101 Controlling step
103 Sensor pattern determining step
105 Rotor magnetic field determining step
107 Position determining step
109 first partial rotor magnetic field determining step
111 second partial rotor magnetic field determining step
113 first partial rotor detecting step
115 second partial rotor detecting step
117 Weighting step
119 Averaging step
121 third partial rotor magnetic field determining step
123 fourth partial rotor magnetic field determining step.
125 third partial rotor detecting step
127 fourth partial rotor detecting step
129 Match determining step
131 Weighting value identifying step
133 Shifting step
135 fifth partial rotor magnetic field determining step.
137 sixth partial rotor magnetic field determining step
139 fifth partial rotor detecting step
141 sixth partial rotor detecting step
143 further weighting step
145 further averaging step
147 seventh partial rotor magnetic field determining step
149 eighth partial rotor magnetic field determining step
151 seventh partial rotor detecting step
153 eighth partial rotor detecting step
155 Rotor position determining step
157 Measured value determining step
159 Magnetic field sensor identifying step
161 further measured value determining step
163 further magnetic field sensor identifying step
165 Detection pattern determining step
167 Rotor detecting step
169 Position identifying step
171 Speed detecting step
173 Magnetic field sensor determining step
175 first identifying step
177 second identifying step
179 third identifying step
181 fourth identifying step
183 further magnetic field sensor determining step
185 further first identifying step
187 further second identifying step
191 further fourth identifying step

TABLE 2

List of reference numerals: 200-514

200 Planar drive system
201 Controller
203 Data connection
205 Neural network
300 Stator module
301 Carrier
303 Stator surface
305 Stator module housing
307 Stator assembly
309 Stator conductor
311 Stator conductor gap
313 Sectional plane
400 Rotor
401 Magnet assembly
402 Rotor magnetic field
403 Free surface
405 Fastening structure
407 first rotor direction
409 second rotor direction
411 third rotor direction
412 Magnet unit
413 first magnet unit
415 second magnet unit
417 third magnet unit
419 fourth magnet unit
420 Position area
421 first position area
422 second position area
423 Movement track
425 Magnetization unit
500 Sensor module
501 Magnetic field sensor
502 Spatial area
503 first identified magnetic field sensor
504 further spatial area
505 adjacent magnetic field sensor
507 first direction
509 second direction
511 first central magnetic field sensor
512 second central magnetic field sensor
513 third central magnetic field sensor
514 fourth central magnetic field sensor

TABLE 3

List of reference symbols

SP Control path
P Rotor position
P1 first position
P2 second position
SM sensor pattern
SM1 first sensor pattern
SM2 second sensor pattern
SM3 third sensor pattern
SM4 fourth sensor pattern
DSM Detection sensor pattern
D1 first orientation direction
D2 second orientation direction
W1 first weighting value
W2 second weighting value
W3 third weighting value
W4 fourth weighting value
Z geometric center
Z1 first geometric center
Z2 second geometric center
Z3 third geometric center
Z4 fourth geometric center
DZ Detection center
DZ1 first detection center
DZ2 second detection center
UB Surrounding area
ZG1 first central weighting area
ZG2 second central weighting area
ZG3 third central weighting area

TABLE 3-continued

List of reference symbols

ZG4 fourth central weighting area
PG Peripheral weighting area
DZ Detection center
DZ1 first detection center
DZ2 second detection center
UB Surrounding area

The invention claimed is:

1. A method for operating a planar drive system, wherein the planar drive system comprises at least a controller, a stator module, and a rotor, wherein the rotor is controllable via a magnetic coupling between a rotor magnetic field of the rotor and a stator magnetic field of the stator module, wherein the stator module comprises a sensor module having a plurality of magnetic field sensors for determining a position of the rotor, and wherein each magnetic field sensor is configured to determine the rotor magnetic field for a spatial region, the method comprising:

controlling the rotor along a control path starting from a first position on the stator module in a controlling step;

determining a sensor pattern of the magnetic field sensors of the sensor module in a sensor pattern determining step, wherein a sensor pattern comprises a subset of the magnetic field sensors of the sensor module of the stator module, wherein the sensor module comprises at least a magnetic field sensor not comprised by the sensor pattern, and wherein a surface of the sensor pattern is at least partially covered by the rotor in a position along the control path;

measuring measured values of the rotor magnetic field with the aid of the magnetic field sensors of the sensor pattern in a rotor magnetic field determining step; and detecting the rotor and determining a second position of the rotor based on the measured values of the rotor magnetic field measured with the aid of the magnetic field sensors of the sensor pattern in a position determining step, wherein the sensor pattern comprises at least a first sensor pattern and a second sensor pattern, wherein the first sensor pattern and the second sensor pattern are shifted with respect to each other in a first orientation direction, and wherein the rotor magnetic field determining step comprises:

measuring first measured values of the rotor magnetic field with the aid of the magnetic field sensors of the first sensor pattern in a first partial rotor magnetic field determining step; and measuring second measured values of the rotor magnetic field with the aid of the magnetic field sensors of the second sensor pattern in a second partial rotor magnetic field determining step;

wherein the position determining step comprises:

detecting the rotor and determining a first partial position of the rotor based on the first measured values of the rotor magnetic field measured with the aid of the magnetic field sensors of the first sensor pattern in a first partial rotor detecting step;

detecting the rotor and determining a second rotor partial position based on the measured values of the rotor magnetic field measured with the aid of the magnetic field sensors of the second sensor pattern in a second partial rotor detecting step;

determining a first weighting value of the first sensor pattern and a second weighting value of the second sensor pattern in a weighting step; and determining the second position of the rotor as a weighted average of the first partial position and the second partial position, taking into account the first weighting value and the second weighting value in an averaging step.

2. The method according to claim 1, wherein the sensor pattern further comprises a third sensor pattern and a fourth sensor pattern, wherein the third sensor pattern and the fourth sensor pattern are shifted with respect to each other in a second orientation direction oriented perpendicular to the first orientation direction, and wherein the rotor magnetic field determining step comprises:
measuring third measured values of the rotor magnetic field with the aid of the magnetic field sensors of the third sensor pattern in a third partial rotor magnetic field determining step; and
measuring fourth measured values of the rotor magnetic field with the aid of the magnetic field sensors of the fourth sensor pattern in a fourth partial rotor magnetic field determining step;
wherein the position determining step comprises:
detecting the rotor and determining a third partial rotor position based on the third measured values of the rotor magnetic field measured with the aid of the magnetic field sensors of the third sensor pattern in a third partial rotor detecting step;
detecting the rotor and determining a fourth partial rotor position based on the fourth measured values of the rotor magnetic field measured with the aid of the magnetic field sensors of the fourth sensor pattern in a fourth partial rotor detecting step;
determining a third weighting value of the third sensor pattern and a fourth weighting value of the fourth sensor pattern in the weighting step; and
determining the second position of the rotor as a weighted average of the first partial position, the second partial position, the third partial position, and the fourth partial position, taking into account the first weighting value, the second weighting value, the third weighting value, and fourth weighting value in the averaging step.

3. The method according to claim 1, wherein the sensor pattern determining step comprises:
determining a first central magnetic field sensor and determining a second central magnetic field sensor and/or determining a third central magnetic field sensor and determining a fourth central magnetic field sensor in a magnetic field sensor determining step, wherein the first central magnetic field sensor and the second central magnetic field sensor and/or the third central magnetic field sensor and the fourth central magnetic field sensor are directly adjacent to the first position and have shortest distances to the first position;
determining a predetermined plurality of first magnetic field sensors surrounding the first central magnetic field sensor and identifying the plurality of first magnetic field sensors as a first sensor pattern in a first identifying step, wherein the first central magnetic field sensor is arranged in a first geometric center of the first sensor pattern;
determining a predetermined plurality of second magnetic field sensors surrounding the second central magnetic field sensor and identifying the plurality of second magnetic field sensors as a second sensor pattern in a second identifying step, wherein the second central magnetic field sensor is located in a second geometric center of the second sensor pattern; and/or
determining a predetermined plurality of third magnetic field sensors surrounding the third central magnetic field sensor, and identifying the plurality of third magnetic field sensors as a third sensor pattern in a third identifying step, wherein the third central magnetic field sensor is located in a third geometric center of the third sensor pattern; and determining a predetermined plurality of fourth magnetic field sensors surrounding the fourth central magnetic field sensor and identifying the plurality of fourth magnetic field sensors as a fourth sensor pattern in a fourth identifying step, wherein the fourth central magnetic field sensor is disposed in a fourth geometric center of the fourth sensor pattern.

4. The method according to claim 1, further comprising:
determining a first matching value of the first position of the rotor on the stator module with a first positioning of the first sensor pattern on the stator module, and determining a second matching value of the first position of the rotor on the stator module with a second positioning of the second sensor pattern on the stator module, and/or
determining a third matching value of the first position of the rotor on the stator module with a third positioning of the third sensor pattern on the stator module and determining a fourth matching value of the first position of the rotor on the stator module with a fourth positioning of the fourth sensor pattern on the stator module in a match determining step;
wherein a matching value assumes a value of 1 when the first position of the rotor matches a positioning of a sensor pattern, assumes a value of 0 when the first position of the rotor does not match a positioning of a sensor pattern, and assumes any value between 1 and 0 when the first position of the rotor partially matches a positioning of a sensor pattern; and
identifying the first weighting value with the first matching value and identifying the second weighting value with the second matching value and/or identifying the third weighting value with the third matching value and identifying the fourth weighting value with the fourth matching value in a weighting value identifying step.

5. The method according to claim 2,
wherein a match of the first position of the rotor on the stator module to a positioning of a sensor pattern is provided if a distance of the first position of the rotor with respect to a specified point of the sensor pattern is less than or equal to a first predetermined limit value,
wherein a match of the first position of the rotor on the stator module to a positioning of a sensor pattern is not provided if a distance of the first position of the rotor to the specified point of the sensor pattern is larger than or equal to a second predetermined limit value, and
wherein a partial match of the first position of the rotor on the stator module with the positioning of the sensor pattern is provided if the distance of the first position of the rotor to the specified point of the sensor pattern is larger than the first predetermined limit value and less than the second predetermined limit value.

6. The method according to claim 5, wherein the specified point of the sensor pattern is defined by a geometric center of the sensor pattern.

7. The method according to claim 1, further comprising:
shifting the first sensor pattern and the second sensor pattern along the first orientation direction and determining a shifted first sensor pattern and a shifted second sensor pattern in a shifting step;

measuring further first measured values of the rotor magnetic field with the aid of the magnetic field sensors of the shifted first sensor pattern in a fifth partial rotor magnetic field determining step;

measuring further second measured values of the rotor magnetic field with the aid of the magnetic field sensors of the shifted second sensor pattern in a sixth partial rotor magnetic field determining step;

detecting the rotor and determining a further first partial position of the rotor based on the further first measured values of the rotor magnetic field measured with the aid of the magnetic field sensors of the shifted first sensor pattern in a fifth partial rotor detecting step;

detecting the rotor and determining a further second partial position rotor based on the further second measured values of the rotor magnetic field measured with the aid of the magnetic field sensors of the shifted second sensor pattern in a sixth partial rotor detecting step;

determining a further first weighting value of the shifted first sensor pattern and a further second weighting value of the shifted second sensor pattern in a further weighting step; and determining a third position of the rotor as a weighted average of the further first partial position and the further second partial position, taking into account the further first weighting value and the further second weighting value in a further averaging step.

8. The method according to claim 7, further comprising:

shifting the third sensor pattern and the fourth sensor pattern along the first orientation direction, and determining a shifted third sensor pattern and a shifted fourth sensor pattern in the shifting step;

measuring further third measured values of the rotor magnetic field with the aid of the magnetic field sensors of the shifted third sensor pattern in a seventh partial rotor magnetic field determining step;

measuring further fourth measured values of the rotor magnetic field with the aid of the magnetic field sensors of the shifted fourth sensor pattern in an eighth partial rotor magnetic field determining step;

detecting the rotor and determining a further third partial position of the rotor based on the further third measured values of the rotor magnetic field measured with the aid of the magnetic field sensors of the shifted third sensor pattern in a seventh partial rotor detecting step;

detecting the rotor and determining a further fourth partial rotor position based on the further fourth measured values of the rotor magnetic field measured with the aid of the magnetic field sensors of the shifted fourth sensor pattern in an eighth partial rotor detecting step;

determining a further third weighting value of the shifted third sensor pattern and a further fourth weighting value of the shifted fourth sensor pattern in the further weighting step; and determining the third position of the rotor as a weighted average of the further first partial position, the further second partial position, the further third partial position, and the further fourth partial position, taking into account the further first weighting value, the further second weighting value, the further third weighting value, and the further fourth weighting value in the further averaging step.

9. The method according to claim 7, wherein the shifting step comprises:

determining a further first central magnetic field sensor and determining a further second central magnetic field sensor and/or determining a further third central magnetic field sensor and determining a further fourth central magnetic field sensor in a further magnetic field sensor determining step, wherein the further first central magnetic field sensor and the further second central magnetic field sensor and/or the further third central magnetic field sensor and the further fourth central magnetic field sensor are directly adjacent to the second position and have shortest distances to the second position;

determining a predetermined plurality of further first magnetic field sensors surrounding the further first central magnetic field sensor and identifying the plurality of further first magnetic field sensors as a shifted first sensor pattern in a further first identifying step, wherein the further first central magnetic field sensor is arranged in a further first geometric center of the shifted first sensor pattern;

determining a predetermined plurality of further second magnetic field sensors surrounding the further second central magnetic field sensor, and identifying the plurality of further second magnetic field sensors as a second shifted sensor pattern in a further second identifying step, wherein the further second central magnetic field sensor is located in a further second geometric center of the shifted second sensor pattern; and/or determining a predetermined plurality of further third central magnetic field sensors surrounding the further third magnetic field sensor, and identifying the plurality of further third magnetic field sensors as a shifted third sensor pattern in a further third identifying step, wherein the further third central magnetic field sensor is located in a further third geometric center of the shifted third sensor pattern; and determining a predetermined plurality of further fourth magnetic field sensors surrounding the further fourth central magnetic field sensor and identifying the plurality of further fourth magnetic field sensors as a shifted fourth sensor pattern in a further fourth identifying step, wherein the further fourth central magnetic field sensor is located in a further fourth geometric center of the shifted fourth sensor pattern.

10. The method according to claim 7, wherein the further first weighting value corresponds to a matching value between the second position of the rotor and a positioning of the first sensor pattern, wherein the further second weighting value corresponds to a matching value between the second position of the rotor and a positioning of the second sensor pattern, wherein the further third weighting value corresponds to a matching value between the second position of the rotor and a positioning of the third sensor pattern, and wherein the further fourth weighting value corresponds to a matching value between the second position of the rotor and a positioning of the fourth sensor pattern.

11. The method according to claim 1, further comprising:

determining the first position of the rotor on the stator module in a rotor position determining step;

wherein the rotor position determining step comprises:

recording measured values from magnetic field sensors of the sensor module in a reading determining step;

identifying a magnetic field sensor of the sensor module, the measured value of which reaches or exceeds a predetermined limit value in a magnetic field sensor identifying step;

recording measured values from magnetic field sensors of the sensor module in the direct vicinity of the first identified magnetic field sensor in a further measured value determining step;

identifying the magnetic field sensors in the immediate vicinity of the first identified magnetic field sensor, the measured values of which reach or exceed the predetermined limit value in a further magnetic field sensor identifying step;

determining a detection sensor pattern in a detection pattern determining step, wherein a detection sensor pattern comprises identified magnetic field sensors;

detecting the rotor based on the measured values from the magnetic field sensors of the detection sensor pattern in a rotor detecting step; and identifying the first position of the rotor based on the location of the identified magnetic field sensors in the stator module in a position identifying step.

12. The method according to claim 1, wherein the sensor pattern determining step comprises:

determining a speed of the rotor in a movement of the rotor along the control path in a speed determining step; and determining the sensor pattern based on the determined speed of the rotor along the control path.

13. The method according to claim 1, wherein determining the first position of the rotor on the stator module, determining the second position of the rotor on the stator module and determining the third position of the rotor on the stator module, as well as determining the first partial position, the second partial position, the third partial position, the fourth partial position, the further first partial position, the further second partial position, the further third partial position and the further fourth partial position are carried out by a trained neural network, and wherein the trained neural network is configured to determine a position of the rotor on the stator module on the basis of the measured values of the rotor magnetic field of the magnetic field sensors of the sensor module, taking into account the positioning of the magnetic field sensors of the sensor module in the stator module.

14. The method according to claim 1, wherein the magnetic field sensors of the sensor module are 1D Hall sensors, 2D Hall sensors or 3D Hall sensors, and wherein a measured value of a magnetic field sensor comprises one, two or three components of the rotor magnetic field.

15. The method according to claim 1, wherein the first position, the second position, and the third position are identical, and wherein controlling the rotor along the control path comprises holding the rotor in the first position.

16. The method according to claim 1, wherein the first position corresponds to a position of the rotor that the rotor assumes on the stator module at a first position determining time, wherein the second position corresponds to a position of the rotor that the rotor assumes on the stator module at a second position determining time, wherein the third position corresponds to a position of the rotor that the rotor assumes on the stator module at a third position determining time, and wherein the determination of the first position and/or the determination of the second position and/or the determination of the third position is performed in successive control cycles of the controller of the planar drive system.

17. A planar drive system comprising at least a controller, a stator module and a rotor, wherein the controller is arranged to execute a method according to claim 1, wherein the rotor may be controlled via a magnetic coupling between a rotor magnetic field of the rotor and a stator magnetic field of the stator module, wherein the stator module comprises a sensor module with a plurality of magnetic field sensors for determining a position of the rotor, and wherein each magnetic field sensor is configured to determine the rotor magnetic field for a spatial region.

* * * * *